United States Patent
Lee et al.

(10) Patent No.: US 8,222,132 B2
(45) Date of Patent: Jul. 17, 2012

(54) FABRICATING HIGH-K/METAL GATE DEVICES IN A GATE LAST PROCESS

(75) Inventors: Da-Yuan Lee, Jhubei (TW); Jian-Hao Chen, Hsinchu (TW); Chi-Chun Chen, Kaohsiung (TW); Matt Yeh, Hsinchun (TW); Hsing-Jui Lee, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 391 days.

(21) Appl. No.: 12/567,227

(22) Filed: Sep. 25, 2009

(65) Prior Publication Data

US 2010/0124818 A1    May 20, 2010

Related U.S. Application Data

(60) Provisional application No. 61/115,415, filed on Nov. 17, 2008, provisional application No. 61/114,702, filed on Nov. 14, 2008.

(51) Int. Cl.
*H01L 21/3205* (2006.01)

(52) U.S. Cl. ........................................ 438/589; 438/540

(58) Field of Classification Search ................. 438/589, 438/240
See application file for complete search history.

(56) References Cited

U.S. PATENT DOCUMENTS
7,871,915 B2 * 1/2011 Lim et al. ..................... 438/592
* cited by examiner

*Primary Examiner* — Kevin M Picardat
*Assistant Examiner* — Neil Prasad
(74) *Attorney, Agent, or Firm* — Haynes and Boone, LLP

(57) ABSTRACT

The present disclosure provides a method that includes forming first and second gate structures over first and second regions, respectively, removing a first dummy gate and first dummy dielectric from the first gate structure thereby forming a first trench and removing a second dummy gate and second dummy dielectric from the second gate structure thereby forming a second trench, forming a gate layer to partially fill the first and second trenches, forming a material layer to fill the remainder of the first and second trenches, removing a portion of the material layer such that a remaining portion of the material layer protects a first portion of the gate layer located at a bottom portion of the first and second trenches, removing a second portion of the gate layer, removing the remaining portion of the material layer from the first and second trenches.

20 Claims, 32 Drawing Sheets

FABRICATING HIGH-K/METAL GATE DEVICES IN A GATE LAST PROCESS

PRIORITY DATA

This application claims priority to U.S. Provisional Application Ser. No. 61/114,702 filed on Nov. 14, 2008, entitled "METHOD FOR N/P PATTERNING IN A GATE LAST PROCESS," and U.S. Provisional Application Ser. No. 61/115,415 filed on Nov. 17, 2008, entitled "HIGH-K DIELECTRIC LAST PROCESS AND DEVICE," the entire disclosures of which are incorporated herein by reference.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices. CMOS devices have typically been formed with a gate oxide and polysilicon gate electrode. There has been a desire to replace the gate oxide and polysilicon gate electrode with a high-k gate dielectric and metal gate electrode to improve device performance as feature sizes continue to decrease. However, problems arise when integrating a high-k/metal gate feature in a CMOS process flow due to various factors such as incompatibility of materials, complex processes, and thermal budgets. For example, one issue for high-k gate dielectric is its lower thermal stability. Accordingly, the high-k gate dielectric quality may change and degrade during one or more thermal process cycles (e.g., dummy poly thermal, SiGe or spacer thermal, and source and drain activation) in the CMOS process flow. Further, patterning the metal layers with a photoresist may induce photoresist peeling, photoresist residue after stripping, and encroachment of the metal etching chemical through the photoresist.

SUMMARY

One of the broader forms of an embodiment of the invention involves a method for fabricating a semiconductor device. The method includes providing a semiconductor substrate having a first region and a second region, forming a first gate structure over the first region and a second gate structure over the second region, the first gate structure including a first dummy dielectric and a first dummy gate, the second gate structure including a second dummy dielectric and a second dummy gate, removing the first dummy gate and first dummy dielectric from the first gate structure thereby forming a first trench and removing the second dummy gate and second dummy dielectric from the second gate structure thereby forming a second trench, forming a gate layer to partially fill the first and second trenches, the gate layer including a high-k dielectric layer, forming a material layer to fill the remainder of the first and second trenches, removing a portion of the material layer such that a remaining portion of the material layer protects a first portion of the gate layer located at a bottom portion of the first and second trenches, respectively, removing a second portion of the gate layer, removing the remaining portion of the material layer from the first and second trenches, respectively, and forming a first metal gate in the first trench and a second metal gate in the second trench.

Another one of the broader forms of an embodiment of the invention involves a method for fabricating a semiconductor device. The method includes providing a semiconductor substrate having a first region and a second region, forming a first gate structure over the first region and a second gate structure over the second region, the first gate structure including a first dummy gate and the second gate structure including a second dummy gate, removing the first dummy gate from the first gate structure thereby forming a first trench, forming a first metal layer to partially fill the first trench, forming a first material layer over the first metal layer, the first material layer substantially filling the remainder of the first trench, removing the first metal layer and the first material layer overlying the second region, removing the second dummy gate from the second gate structure thereby forming a second trench, forming a second metal layer to partially fill the second trench, forming a second material layer over the second metal layer, the second material substantially filling the remainder of the second trench, removing the metal and material layers outside of the first and second trenches. removing the first material layer from the first trench and the second material layer from the second trench, and forming a third metal layer to substantially fill the first and second trenches.

Yet another one of the broader forms of an embodiment of the invention involves a method for fabricating a semiconductor device. The method includes providing a semiconductor substrate having a first region and a second region, forming a first gate structure over the first region and a second gate structure over the second region, the first gate structure including a first dummy gate and the second gate structure including a second dummy gate, forming an interlayer dielectric (ILD) over the first and second gate structures, performing a first chemical mechanical polishing (CMP) on the ILD to expose the first and second dummy gates, removing the first dummy gate from the first gate structure thereby forming a first trench, forming a first metal layer to partially fill the first trench, the first metal layer having a first work function, forming a first material layer over the first metal layer, the first material layer substantially filling the remainder of the first trench, removing the second dummy gate from the second gate structure thereby forming a second trench, forming a second metal layer to partially fill the second trench, the second metal layer having a second work function different from the first work function, forming a second material layer over the second metal layer, the second material layer substantially filling the remainder of the second trench, the second material layer being formed of substantially the same material as the first material layer, performing a second CMP that substantially stops at the ILD, removing the first material layer from the first trench and the second material layer from the second trench, and forming a third metal layer to substantially fill the first and second trenches.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In addition, the present disclosure provides examples of a "gate last" metal gate process, however one skilled in the art may recognize applicability to other processes and/or use of other materials.

Figure 1:
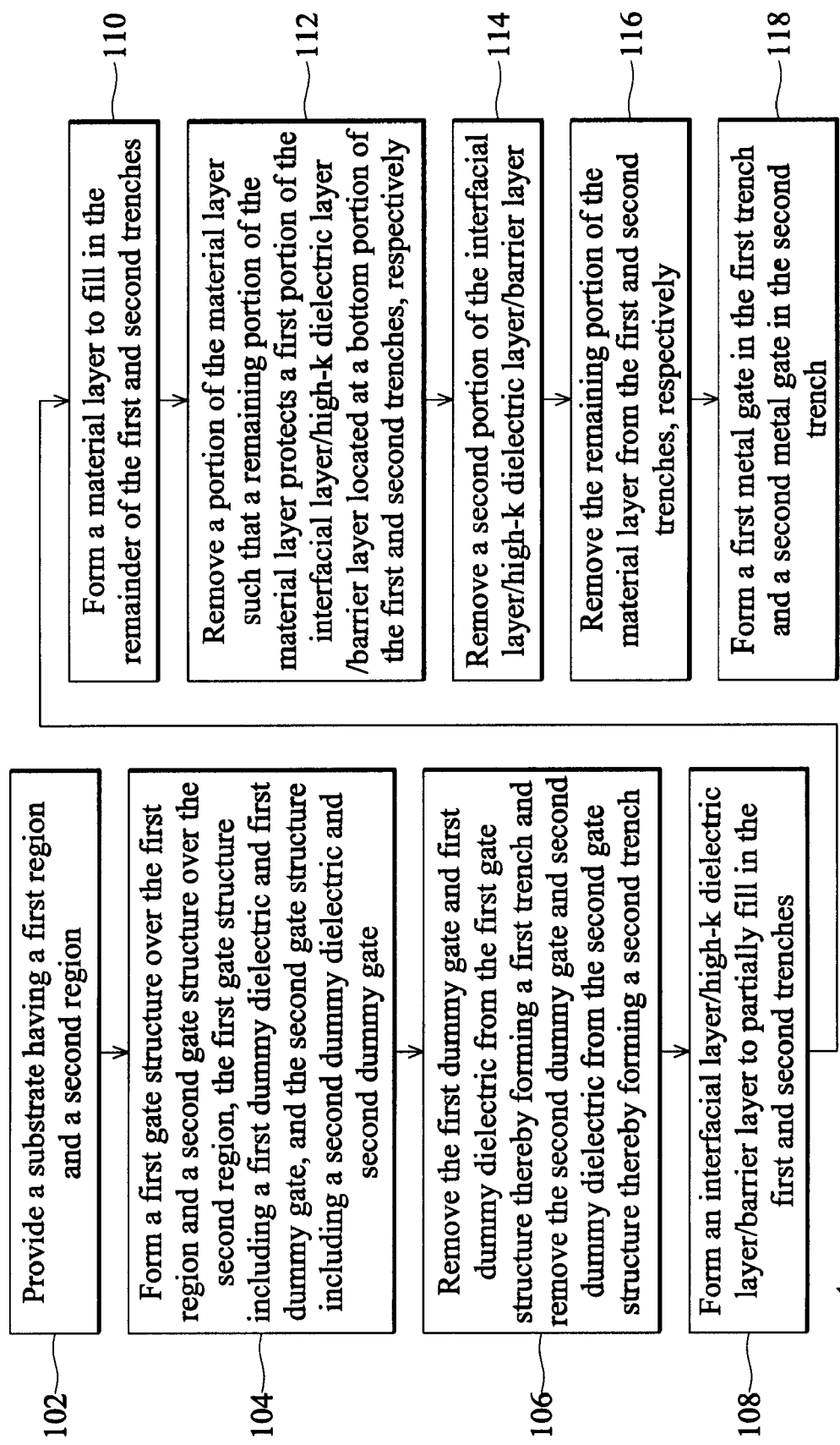
FIG. 1 is a flowchart illustrating a method for fabricating a semiconductor device with a high-k gate dielectric according to various aspects of the present disclosure.
Figure 2A:
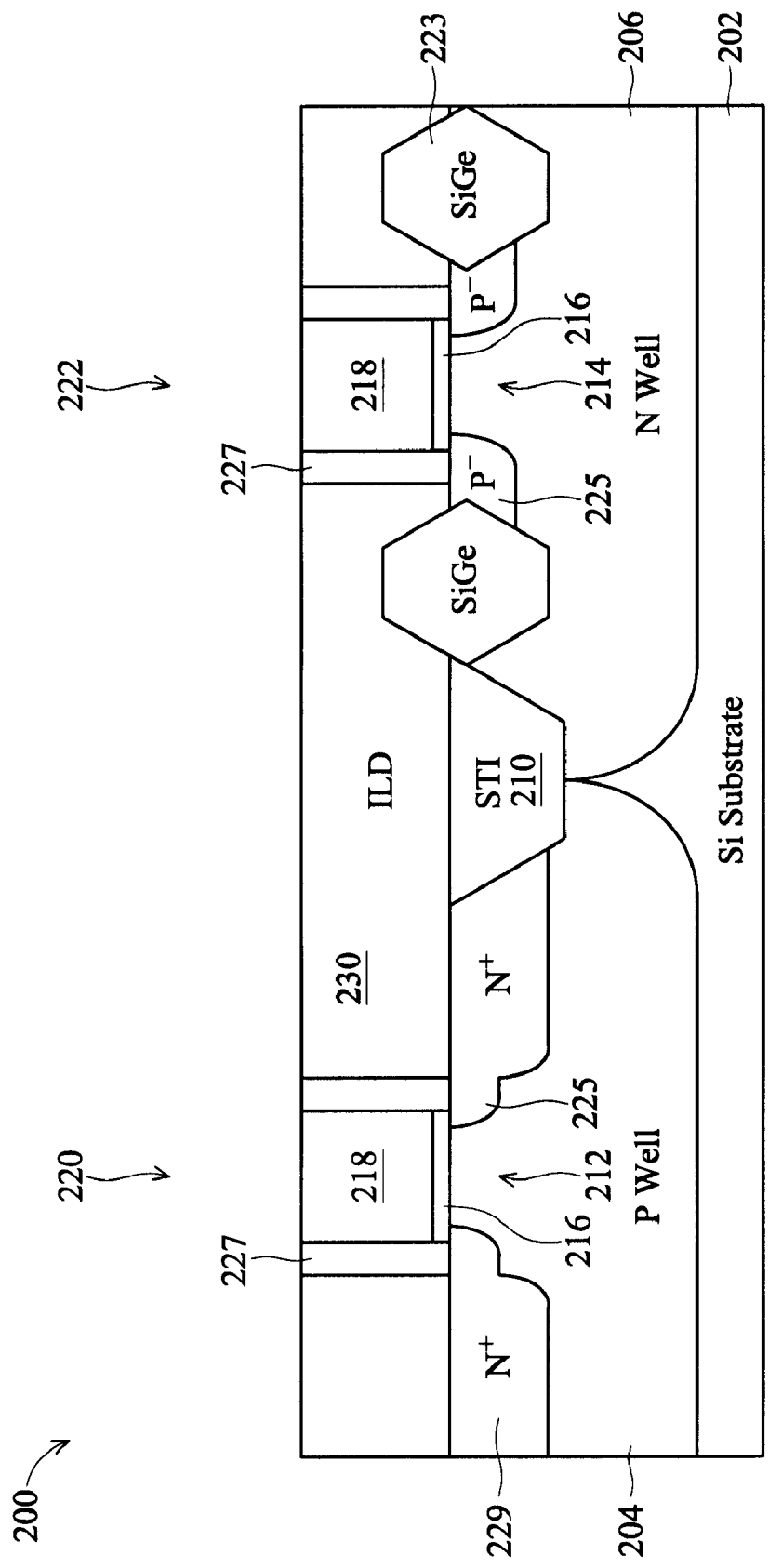
FIGS. 2A to 2L are cross-sectional views of a semiconductor device at various stages of fabrication according to the method of FIG. 1.

Referring to FIG. 1, illustrated is a flowchart of a method 100 for fabricating a semiconductor device with a high-k gate dielectric according to various aspects of the present disclosure. Referring also to FIGS. 2A to 2L, illustrated are cross-sectional views of a semiconductor device 200 at various stages of fabrication according to the method 100 of FIG. 1. It should be noted that part of the semiconductor device 200 may be fabricated with a CMOS process flow. Accordingly, it is understood that additional processes may be provided before, during, and after the method 100 of FIG. 1, and that some other processes may only be briefly described herein. The semiconductor device 200 may be fabricated in a gate last process (also referred to as a replacement poly gate process). In a gate last process, a dummy dielectric and dummy poly gate structure may be initially formed and may be followed a normal CMOS process flow until deposition of an interlayer dielectric (ILD). The dummy dielectric and dummy poly gate structure may then be removed and replaced with a high-k gate dielectric/metal gate structure. In FIG. 2A, the semiconductor 200 is shown following a chemical mechanical polishing (CMP) on an interlayer dielectric (ILD) that exposes the dummy poly gates.

The method 100 begins with block 102 in which a semiconductor substrate is provided, the substrate having a first region and a second region. The semiconductor device 200 includes a semiconductor substrate 202 such as a silicon substrate. The substrate 202 may alternatively include silicon germanium, gallium arsenic, or other suitable semiconductor materials. The substrate 202 may further include doped regions such as a P-well 204 and N-well 206. The substrate 202 may further include other features such as a buried layer, and/or an epitaxy layer. Furthermore, the substrate 202 may be a semiconductor on insulator such as silicon on insulator (SOI). In other embodiments, the semiconductor substrate 202 may include a doped epi layer, a gradient semiconductor layer, and/or may further include a semiconductor layer overlying another semiconductor layer of a different type such as a silicon layer on a silicon germanium layer. In other examples, a compound semiconductor substrate may include a multilayer silicon structure or a silicon substrate may include a multilayer compound semiconductor structure.

The semiconductor device 200 further includes an isolation structure 210 such as a shallow trench isolation (STI) feature formed in the substrate 202 for isolating active regions 204 and 206 of the substrate. Alternatively, the isolation structure 210 may optionally include a local oxidation of silicon (LOCOS) configuration. The isolation structure 210 may be formed of silicon oxide, silicon nitride, silicon oxynitride, fluoride-doped silicate (FSG), and/or a low k dielectric material known in the art. The active region may be configured as an NMOS device 212 (e.g., nFET) and the active region may be configured as a PMOS device 214 (e.g., pFET).

The method 100 continues with block 104 in which a first gate structure is formed over the first region and a second gate structure may be formed over the second region, the first gate structure including a first dummy dielectric and a first dummy gate and the second gate structure including a second dummy dielectric and a second dummy gate. The formation of the gate structures includes forming various material layers, and etching/patterning the various material layers to form a gate structure of the nFET 212 device and a gate structure of the pFET 214 device.

In the present embodiment, the semiconductor device 200 includes a dummy dielectric layer 216 formed on the substrate 202. The dummy dielectric layer 216 may include an oxide (e.g., thermal or chemical oxide formation). The dummy dielectric layer 216 may include a thickness ranging from 10 to about 50 angstrom (A). The semiconductor device 200 may further include a dummy polysilicon (or poly) layer 218 formed over the dummy dielectric layer 216 by a suitable deposition process. For example, silane ($SiH_4$), di-silane ($Si_2H_6$), or di-clorsilane ($SiCl_2H_4$) may be used as a chemical gas in a chemical vapor deposition (CVD) process to form the dummy poly layer 218. The dummy poly layer 218 may include a thickness ranging from about 200 to about 2000 angstrom (A). The semiconductor device 200 may further include a hard mask layer (not shown) formed on the dummy poly layer 218. The hard mask layer may include silicon nitride, silicon oxynitride, silicon carbide, and/or other suitable dielectric materials, and may be formed using a method such as CVD or physical vapor deposition (PVD or sputtering). The hard mask layer may include a thickness ranging from about 100 to about 400 angstrom (A). Additionally, an antireflective coating layer or bottom antireflective coating (BARC) layer may be used to enhance a photolithography process for patterning a photoresist layer. For example, a patterned photoresist layer (not shown) may be formed on the hard mask layer including a gate pattern overlying the nFET 212 and a gate pattern overlying the pFET 214. The gate patterns may be used to pattern the hard mask layer by a dry etch or wet etch process.

The patterned hard mask may be used to form a gate structure 220 in the nFET 212 device side and a gate structure 222 in the pFET 214 device side by a dry etch, wet etch, or combination dry and wet etch process. Accordingly, the gate structures 220, 222 may each include a dummy dielectric 216, a dummy poly gate 218, and a hard mask.

After formation of the gate structures 220, 220 (e.g., gate etching or patterning), it is understood that the semiconductor device 200 may undergo additional CMOS processing to form various features of the nFET 212 and pFET 214 as is known in the art. As such, the various features are only briefly discussed herein. The various features may include SiGe features 223, lightly doped source/drain regions (n-type and p-type LDD) 225, sidewall or gate spacers 227, source/drain (S/D) regions 229, silicide features, contact etch stop layer (CESL), and an interlayer dielectric (ILD) 230. It should be noted that the SiGe features 223 are optional, and that a strained layer may be implemented for the nFET 212 and/or the pFET 214 device to boost the performance of the device. The ILD 230 may include an oxide formed by a high aspect ratio process (HARP) and/or high density plasma (HDP) deposition process. The deposition of the ILD 230 fills in the gaps between the adjacent gate structures 220, 222 of the nFET 212 and pFET 214, respectively. Thereafter, a chemical mechanical polishing (CMP) process may be performed on the ILD 230 to planarize the ILD until the dummy poly gates 218 are exposed in the nFET 212 and pFET 214 devices.

The method 100 continues with block 106 in which the first dummy dielectric and first dummy gate are removed from the first gate structure thereby forming a first trench and the second dummy dielectric and second dummy gate may be removed from the second gate structure thereby form a second trench.

Figure 2B:
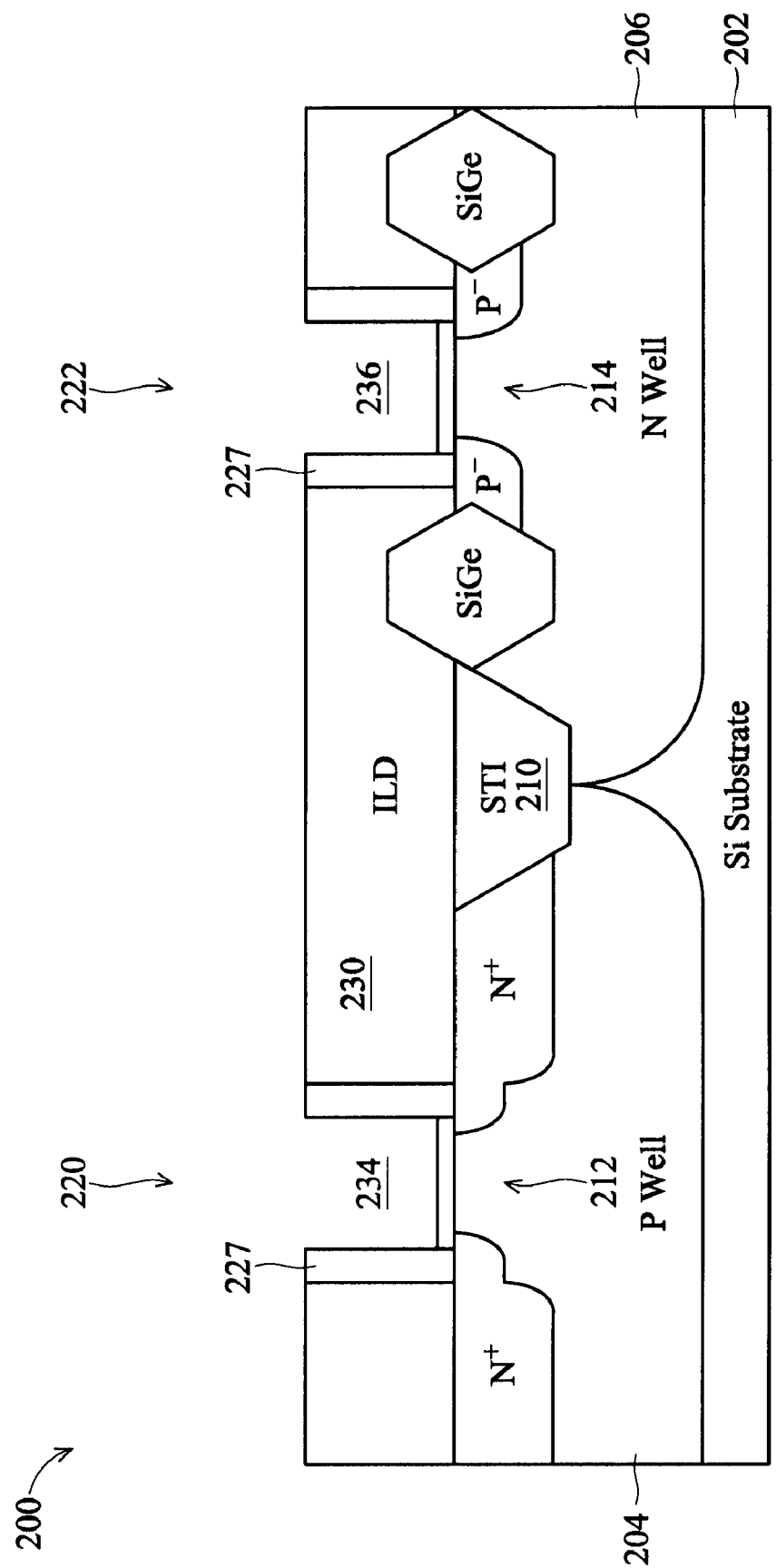

In FIG. 2B, the dummy poly gate 218 and dummy dielectric 216 in the gate structure 220 of the nFET 212 side and the dummy poly gate 218 and dummy dielectric 216 in the gate structure 222 of the pFET 214 side are removed by a dry etch, wet etch, combination dry and wet etch, or other suitable process. The dummy poly gates 218 and dummy dielectrics 216 may be removed in a single-step etching process or multiple-step etching process. For example, a first wet etch process may be used to remove the dummy poly gates 218. The first wet etch process may include exposure to a hydroxide containing solution (e.g., ammonium hydroxide), deionized water, and/or other suitable etchant solutions. A second wet etch process may used to remove the dummy dielectric 216. The second wet etch process may include exposure to a buffered HF solution or a buffered oxide etchant (BOE). The second wet etch process may selectively remove the dummy dielectric 216 and may stop at the substrate 202, thereby forming a trench 234 in the gate structure 220 of the nFET 212 device side and a trench 236 in the gate structure 222 of the pFET 214 device side. It is understood that other etching chemicals may be used for selectively removing the dummy dielectric and dummy poly gate.

The method 100 continues with block 108 in which an interfacial layer, high-k dielectric layer, and barrier layer are formed to partially fill in the first and second trenches.

Figure 2C:
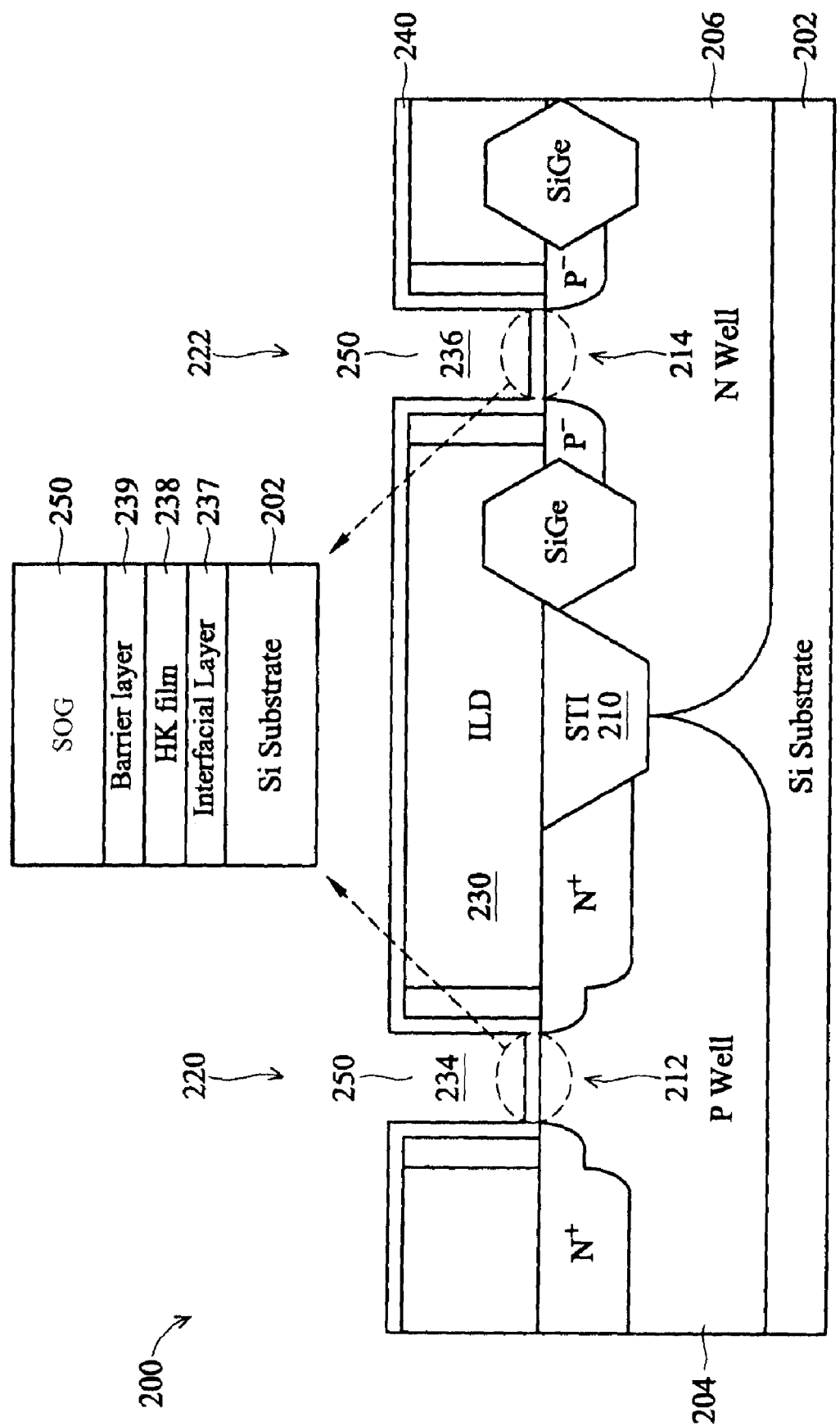

In FIG. 2C, an interfacial layer 237, high-k dielectric layer 238, and barrier layer 239 (collectively referenced as 240) are formed to partially fill in the trenches 234, 236. The interfacial layer 237 may include a silicon oxide ($SiO_2$) layer (e.g., thermal or chemical oxide formation) having a thickness ranging from about 5 to about 20 angstrom (A). Alternatively, the interfacial layer 237 may optionally include HfSiO or SiON formed by atomic layer deposition (ALD), CVD, PVD, thermal oxidation and nitridation, plasma oxidation and nitridation, or combinations thereof. In some embodiments, an Hf film may be formed on a thermal oxide by ALD, CVD, or PVD, and then oxidized by thermal O2 to form HfSiO. In other embodiments, an Hf film may be formed by ALD, CVD, or PVD in a reactive $O_2$ and $H_2O$ ambient.

The high-k dielectric layer 238 may be formed on the interfacial layer 237. The high-k dielectric layer 238 may be formed by ALD, CVD, metalorganic CVD (MOCVD), PVD, plasma enhanced CVD (PECVD), plasma enhance ALD (PEALD), thermal oxidation, combinations thereof, or other suitable technique. The high-k dielectric layer 238 may include a thickness ranging from about 5 to about 20 angstrom (A). The high-k dielectric layer 238 may include a binary or ternary high-k film such as HfOx. Alternatively, the high-k dielectric layer 216 may optionally include other high-k dielectrics such as LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides, or other suitable materials. A post high-k deposition anneal may be performed in some embodiments.

The barrier layer 239 may be formed over the high-k dielectric layer 238. The barrier layer 239 may include TiN or TaN having a thickness ranging from about 5 to about 20 angstrom (A). Alternatively, the barrier layer 239 may optionally include $Si_3N_4$. The barrier layer 239 may function as a barrier to protect the high-k dielectric layer 238 and a subsequent dummy material layer. The barrier layer 239 may be formed by various deposition techniques such as ALD, PVD, CVD, or other suitable technique.

The method 100 continues with block 110 in which a material layer is formed to fill in the remainder of the first and second trenches.

A material layer 250 is formed over the interfacial layer/high-k dielectric layer/barrier layer (IL/HK/barrier layer) 240. For example, the material layer 250 may include a spin-on-glass (SOG). The SOG layer 250 may substantially fill in the remainder of the trenches 234, 236. It should be noted that the SOG is capable of filling in small gaps, and thus the risk of forming voids in the trenches 234, 236 may be minimized. The SOG layer 250 may function as a second dummy gate layer such that the SOG layer 250 will be replaced with a metal gate as discussed below. Further, a high etching selectivity between the SOG 250 and barrier layer (of the IL/HK/barrier layer 240) in the gate structures 220, 222 provides for better control in subsequent processing. Alternatively, the material layer 250 may include other materials that are suitable for filling in trench 234 and protecting the underlying IL/HK/barrier layer 240 during subsequent processing. For example, the material layer 250 may optionally include a polymer, ceramic (with a low melting point), liquid crystal, and other dielectric materials. The polymer and ceramic may include polymer resins and metal oxides, respectively, that are typically used in semiconductor manufacturing. The SOG layer 250 may be planarized by an etch back process or CMP process that substantially stops at the barrier layer (of the IL/HK/barrier layer 240). Accordingly, the SOG layer 250 may remain in the trenches 234, 236 and may function as a second dummy gate.

The method 100 continues with block 112 in which a portion of the material layer is removed such that a remaining portion of the material layer protects a first portion of the interfacial layer/high-k dielectric layer/barrier layer located at a bottom portion of the first and second trenches, respectively.

Figure 2D:
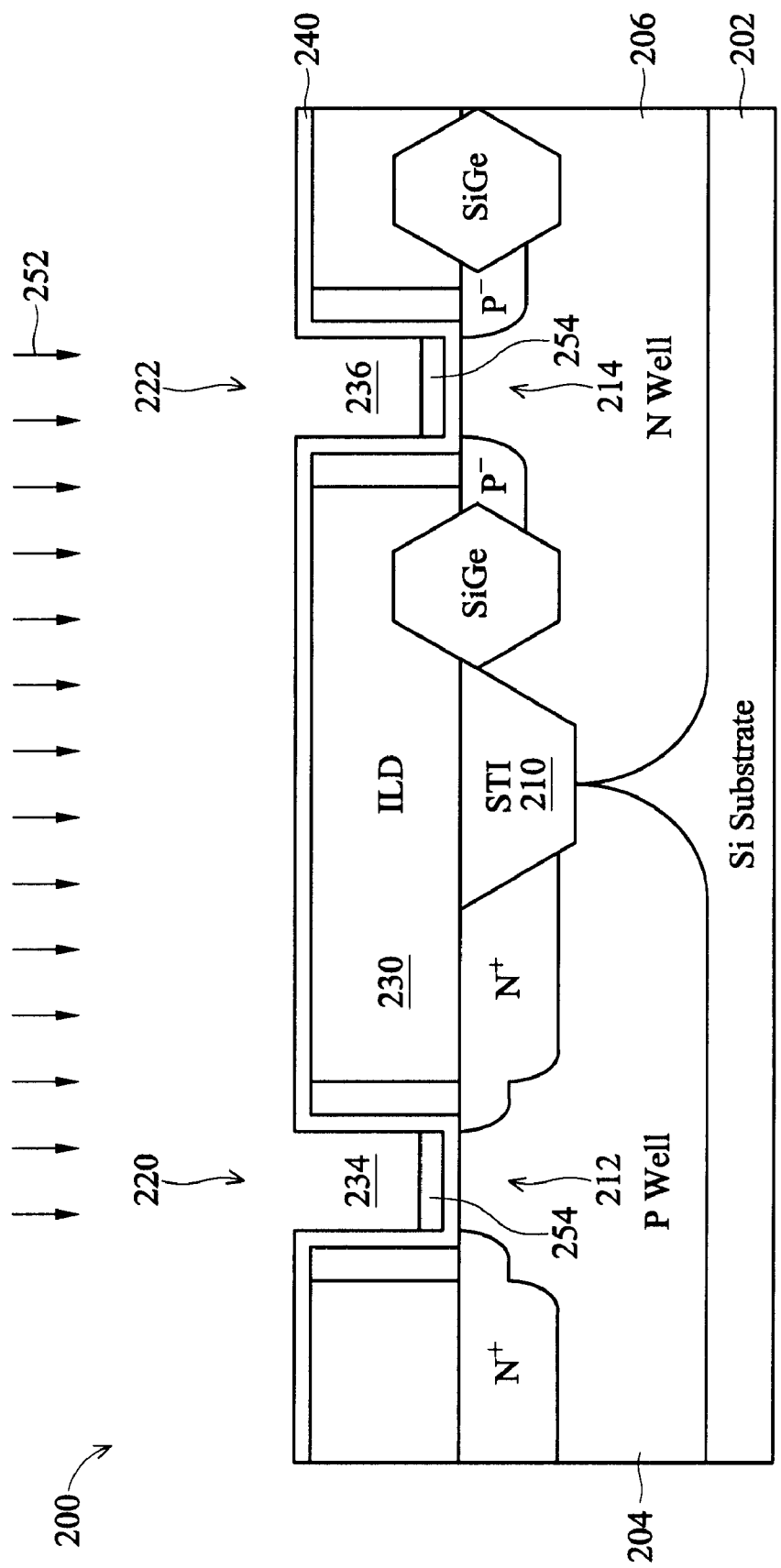

In FIG. 2D, a dry etching process 252 may be used to remove a portion of the SOG layers 250 from the trenches 234, 236. The dry etching process 252 may be performed with an ambient of CHC13, CHBr3, CCl4, CF4, C2F6 at a pressure ranging from 30 to about 100 mT. The dry etching process 252 has a high selectively between the SOG and the barrier layer. Accordingly, the barrier layer (of the IL/HK/barrier layer 240) may function as the etch stop layer. The dry etching process 252 may be performed for a predetermined amount of time to achieved a desired thickness. In some embodiments, the SOG layer 254 that remains in the trenches may have a thickness ranging from about 10 to about 100 angstrom (A).

The method 100 continues with block 114 in which a second portion of the interfacial layer, high-k dielectric layer, and barrier layer is removed.

Figure 2E:
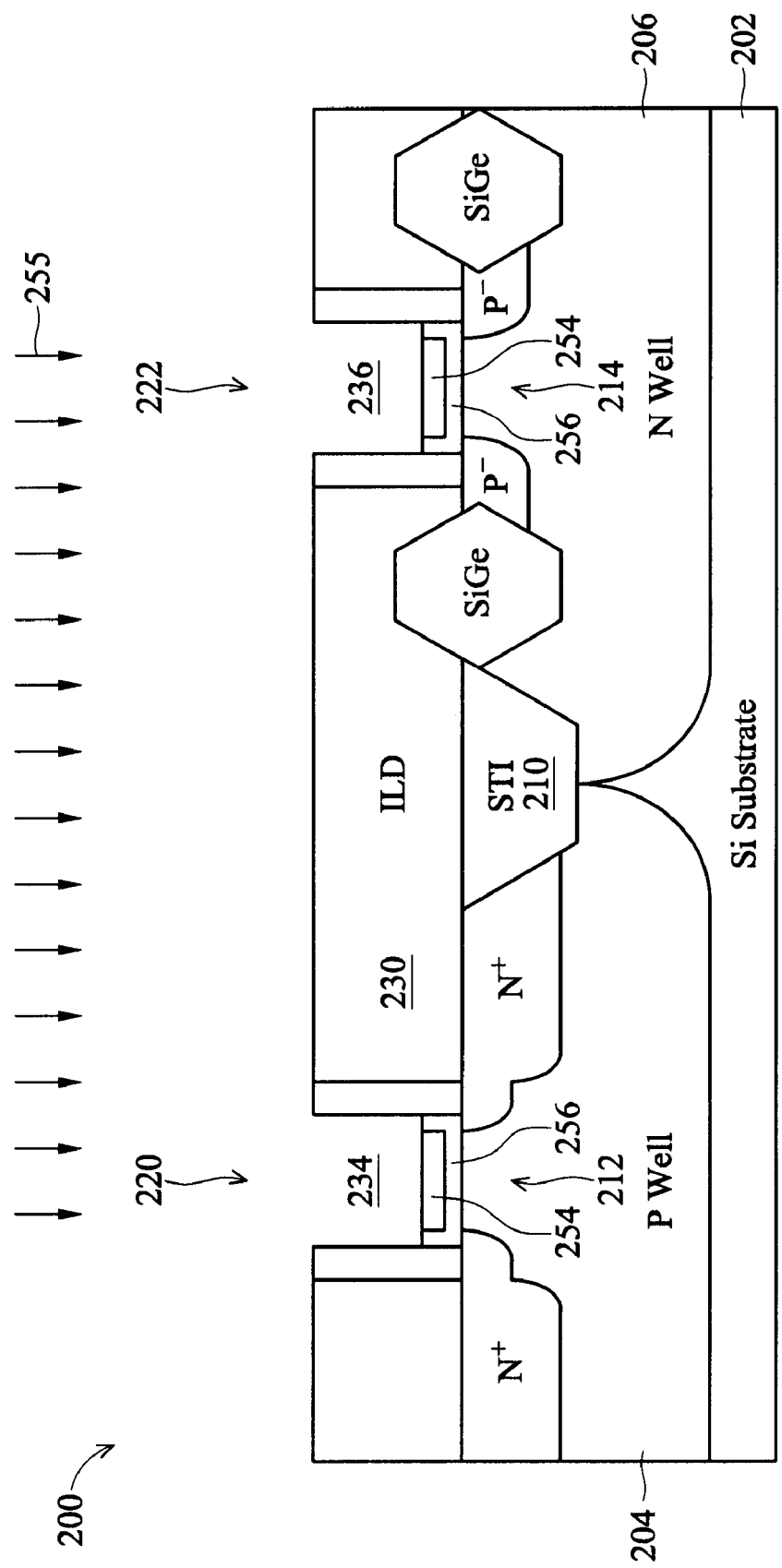

In FIG. 2E, a wet etching process 255 may be performed to remove a portion of the IL/HK/barrier layer 240. The wet etching process 255 may include a multi-step etching process. For example, the barrier layer may be etched by a etching solution of ammonium ($NH_3$) hydrogen peroxide ($H_2O_2$) mixture (also referred to as APM). The APM may include a ratio of about 1:1:100 to about 1:1:5 ($NH_3:H_2O_2:H_2O$). The APM may have a temperature ranging from about 25 to about 80 degree C. The IL/HK layer may then be etched by a buffered HF solution or a buffered oxide etchant (BOE) having a ratio ranging from about 1:50 to about 1:500. The buffered HF solution or BOE solution may have a temperature ranging from about 25 to about 100 degree C. It should be noted that the remaining SOG layer 254 in the trenches 234, 236, respectively, protects the underlying IL/HK/barrier layer 240 from being etched by the etching process 255. Thus, following the wet etching process 255, an IL/HK/barrier layer 256 located at the bottom and on a lower portion of the sidewalls of the trenches 234, 236, respectively, remains unetched. The IL/HK/barrier layer 256 in the trenches 234, 236, respectively, may have a cross sectional profile that is horn shaped. That is, the IL/HK/barrier layer 256 may have portions that extend upwards (from the bottom of the trench) on both sidewalls of the trench. As previously noted, the remaining SOG layer 254 may include a thickness ranging from about 10 to about 100 angstrom (A). Accordingly, the portion of the IL/HK/barrier layer 256 on the sidewalls of the trenches 234, 236, respectively, may extend 10 to about 100 angstrom (A).

The method 100 continues with block 116 in which the remaining portion of the material layer in the first and second trenches, respectively, are removed. A dry etching process may be used to remove the remaining SOG layers 254 from the trenches 234, 236, respectively. The dry etching process may be performed with an ambient of CHC13, CHBr3, CCl4, CF4, C2F6 at a pressure ranging from 30 to about 100 mT. The dry etching process has a high selectively between the SOG and the barrier layer (of the IL/HK/barrier layer 256). Accordingly, the barrier layer may function as an etch stop layer and may protect the underlying high-k dielectric layer during the etching process.

The method 100 continues with block 118 in which a first metal gate is formed in the first trench and a second metal gate may be formed in the second trench. FIGS. 2F to 2L illustrate one example of forming metal gates for the nFET 212 and pFET 214 devices. In the present embodiment, a P-type work function metal is formed first and an N-type work function metal is formed second. It is understood that in other embodiments the N-type work function metal is formed first and the P-type work function metal is formed second.

Figure 2F:
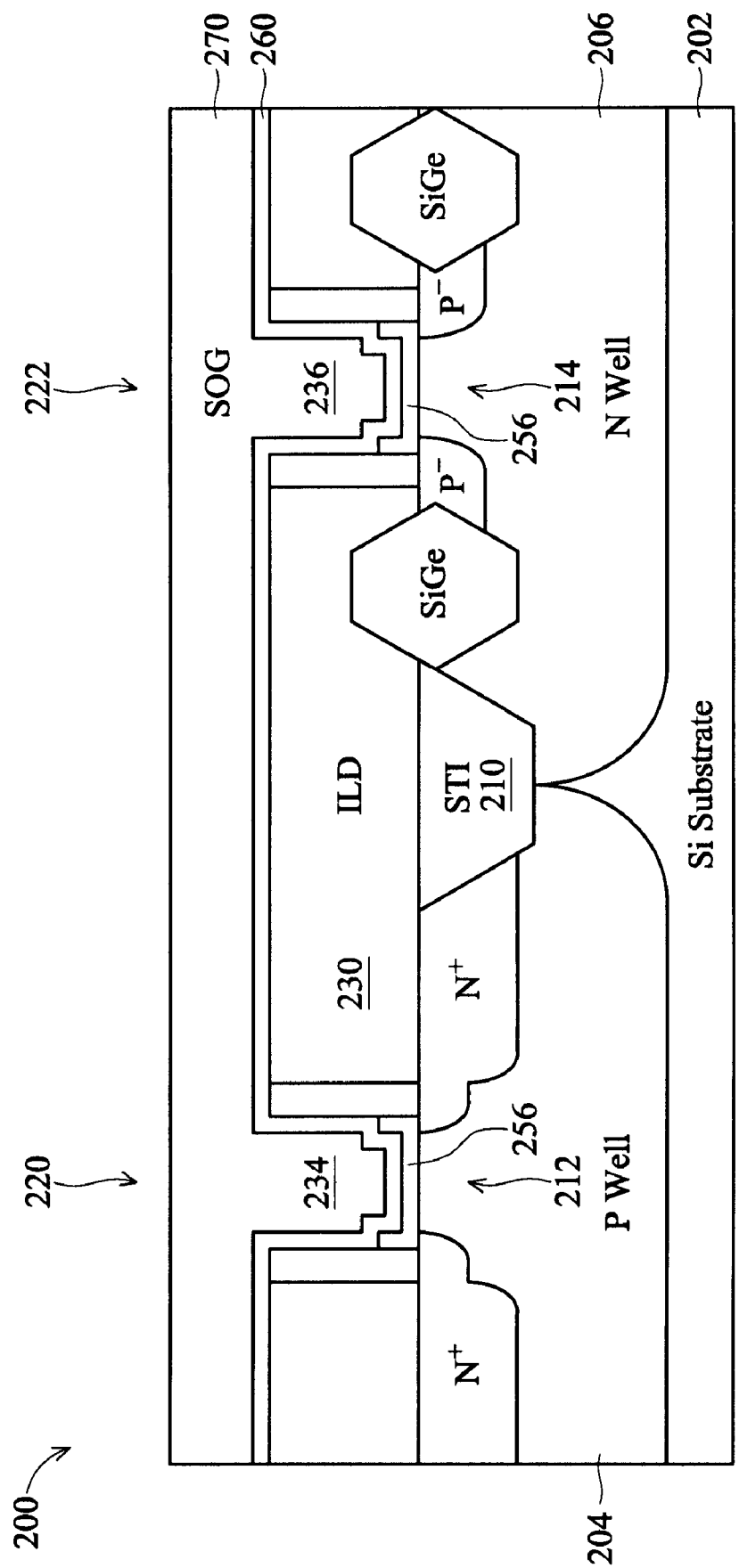

In FIG. 2F, a work function metal layer may be formed to partially fill in the trenches 234, 236. In the present embodiment, a P-type work function metal (P-metal) 260 may be formed over the IL/HK/barrier 256 of the gate structures 220, 222, and may fill in a portion of the trenches 234, 236. The P-metal 260 may include a layer of TiN and may have a thickness ranging from about 10 to about 100 angstrom (A). The P-metal layer 260 may be formed by ALD, PVD, CVD, or other suitable process. Alternatively, the P-metal layer 260 may optionally include other suitable metals, such as WN, TaN, or Ru, that properly perform in the pFET 214. Further, the P-metal layer 260 may also include a multi-metal layer structure such as TiN/WN.

A material layer 270 may be formed on the P-metal layer 260 by a spin-on or spin-coating process. For example, the material layer 270 may include a spin-on-glass (SOG). The SOG layer 270 may substantially fill in the remainder of the trenches 234, 236. It should be noted that the SOG is capable of filling in small gaps, and thus the risk of forming voids in the trenches 234, 236 may be minimized. Further, a high etching selectivity between the SOG layer 270 and metal layer 260 provides for good process control during subsequent patterning of the metal layers as discussed below. Alternatively, the material layer 270 may include other materials that are suitable for filling in trenches 234, 236 and adhering to the underlying P-metal layer 260. For example, the material layer 270 may optionally include a polymer, ceramic (with a low melting point), liquid crystal, and other dielectric materials. The polymer and ceramic materials may include polymer resins and metal oxides, respectively, that are typically used in semiconductor manufacturing.

Figure 2G:
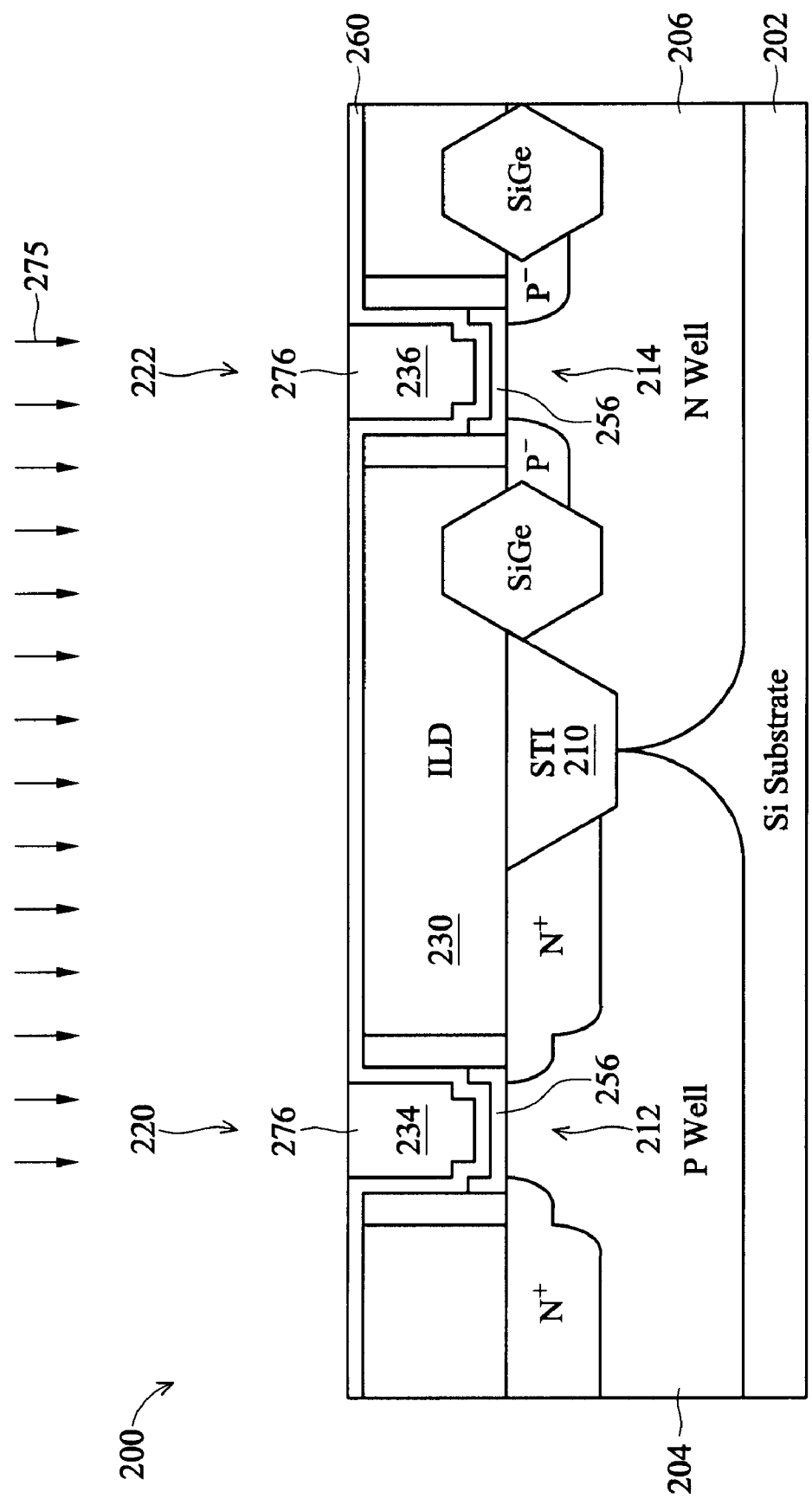

In FIG. 2G, a CMP 275 may be performed on the SOG layer 270 that substantially stops at the P-metal layer 260 located outside of the trenches 234, 236. It should be noted that the high selectivity between the metal layer and SOG layer provides for good control to stop the CMP 275 at the metal layer 240. Following the CMP 275, a portion of the SOG layer 276 remains in the trenches 234, 236 of gate structures 220, 222, respectively.

Figure 2H:
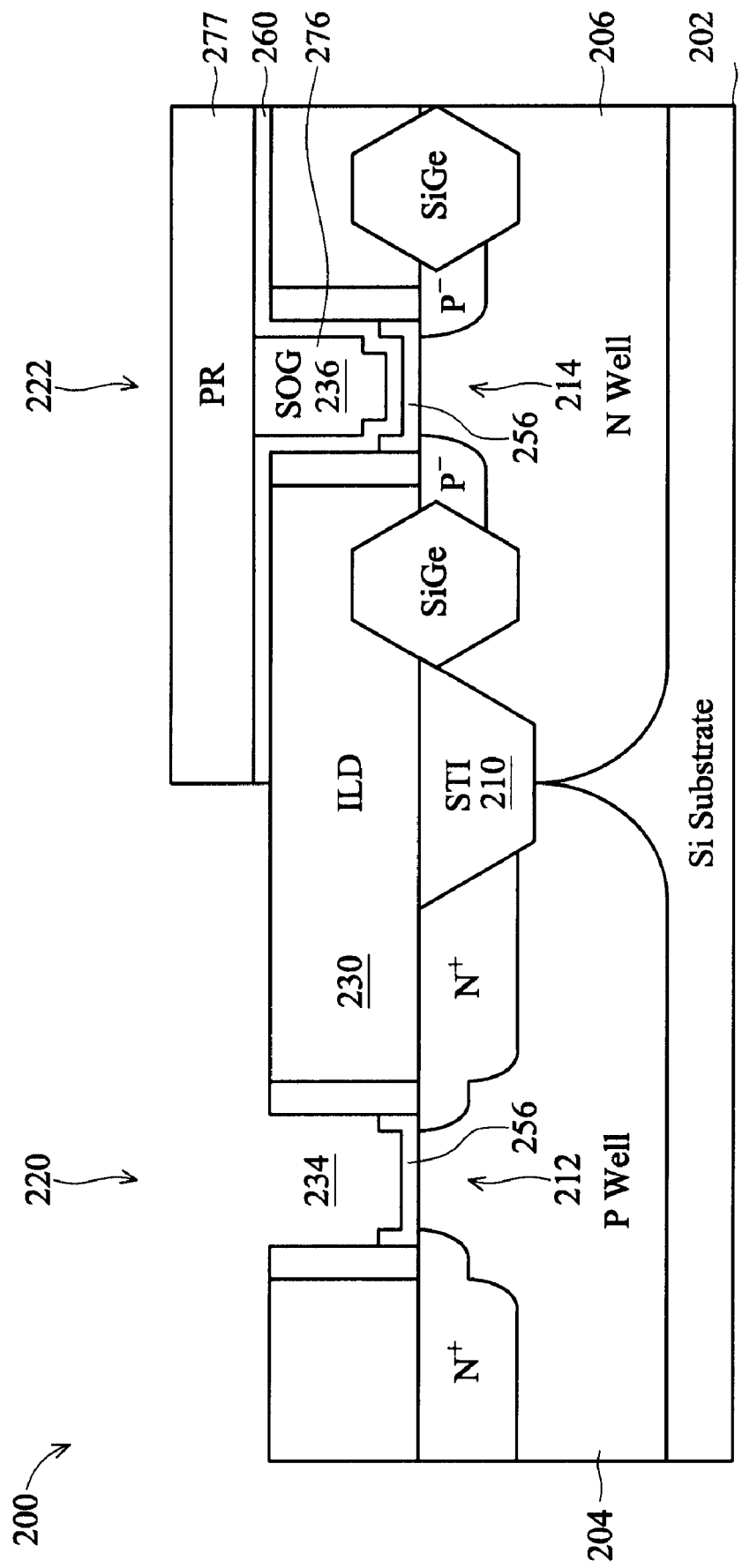

In FIG. 2H, a patterned photoresist layer 277 may be formed to protect the SOG layer 276 and P-metal layer 260 in the pFET 214 side. The patterned photoresist layer 277 may be formed by photolithography patterning as is known in the art. The unprotected SOG layer 276 and P-metal layer 260 in the nFET 212 side may be removed by a dry etching process, a wet etching process, or combination wet and dry etching process. Additionally, the etching may be performed by a single etching step or multiple step etching process. For example, a dry etch process may be used to remove the SOG layer 276 from the trench 234 with an ambient of CHC13, CHBr3, CCl4, CF4, C2F6 at a pressure ranging from 30 to about 100 mT. Alternatively, a wet etching process using a solution of diluted HF (DHF) and solvent may be used to remove the unprotected SOG layer 276 from the trench 234. Further, a wet etching process using a solution of NH4OH: H2O2:de-ionzied water or other suitable etchant may be used to selectively remove the P-metal layer 260 in the nFET 212 side. The patterned photoresist layer 277 may be removed by a stripping process or other suitable process. Alternatively, the SOG layer 276 and P-metal layer 260 in the nFET 212 side may be removed by a single wet etching process.

Figure 2I:
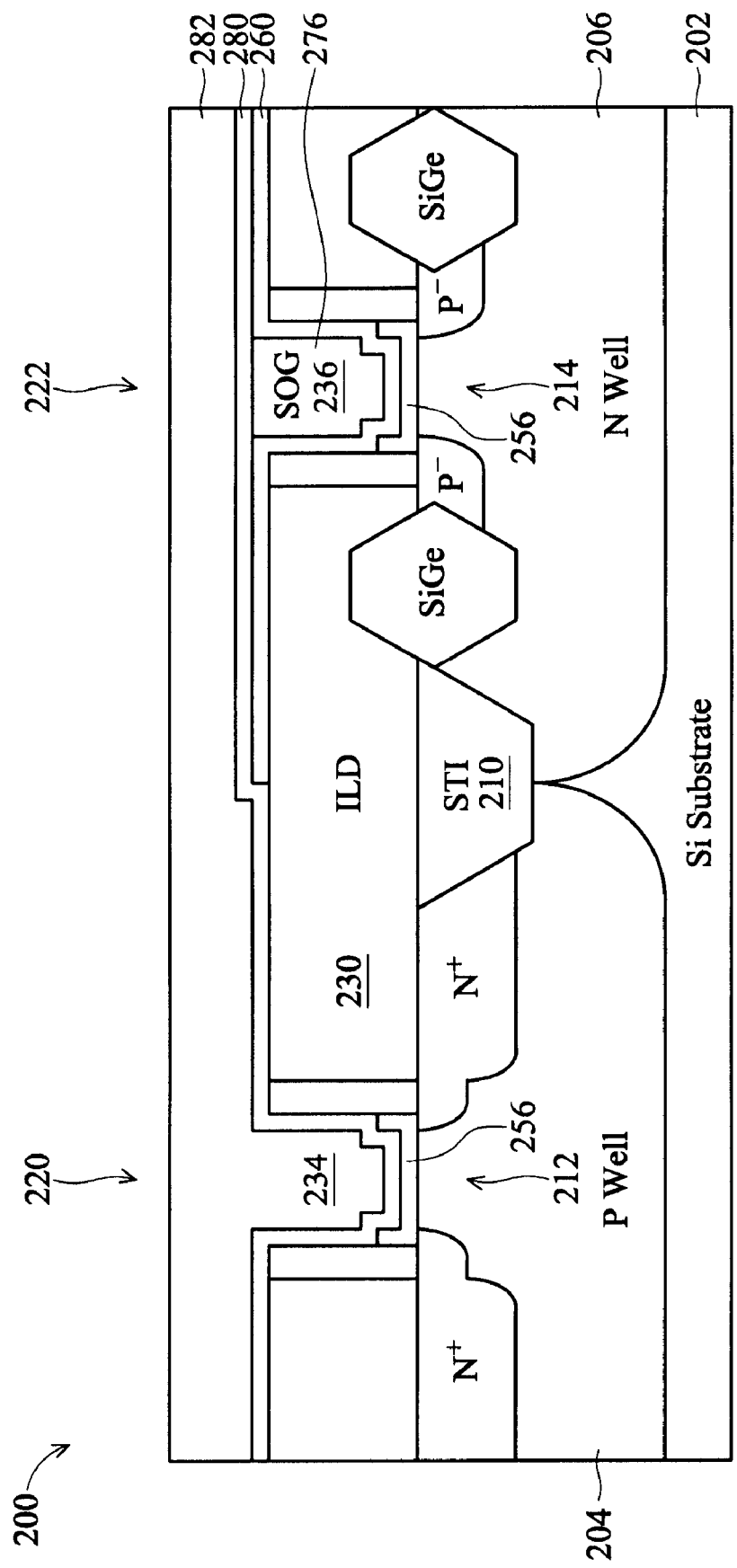

In FIG. 2I, a work function metal layer may be formed to partially fill in the trench 234 in the nFET 212 side. In the present embodiment, an N-type work function metal (N-metal) 280 may be formed over the IL/HK/barrier layer 256 of the gate structure 220, and may fill in a portion of the trench 234. The N-metal 280 may include a layer of TiAl and may have a thickness ranging from about 10 to about 100 angstrom (A). The N-metal layer 280 may be formed by ALD, PVD, CVD, or other suitable process. Alternatively, the N-metal layer 280 may optionally include other suitable metals, such as Ti, Ag, Al, TiAlN, TaC, TaCN, TaSiN, Mn, or Zr that properly perform in the nFET 212. Further, the N-metal layer 280 may also include a multi-metal layer structure.

Still referring to FIG. 2I, a material layer 282 may be formed over the N-metal layer 280 by a spin-on or spin-coating process. In the present embodiment, the material layer 282 may be formed of the same material as the material layer 270. The material layer 282 may include a spin-on-glass (SOG). The SOG layer 282 may substantially fill in the remainder of the trench 234. It should be noted that the SOG is capable of filling in small gaps, and thus the risk of forming voids in the trench 234 may be minimized. Further, a high etching selectivity between the SOG layer 282 and metal layer 280 provides for good r process control during subsequent patterning of the metal layers as discussed below. Moreover, the SOG layer 282 is able to withstand encroachment of a metal etching chemical during subsequent patterning of the metal layers. Alternatively, the material layer 282 may optionally include other dielectric materials that are suitable for filling in the trench 234 and adhering to the underlying N-metal layer 280 during subsequent processing. For example, the material layer 282 may optionally include a polymer, ceramic (with a low melting point), liquid crystal, and other dielectric materials. The polymer and ceramic may include polymer resins and metal oxides, respectively, that are typically used in semiconductor manufacturing.

Figure 2J:
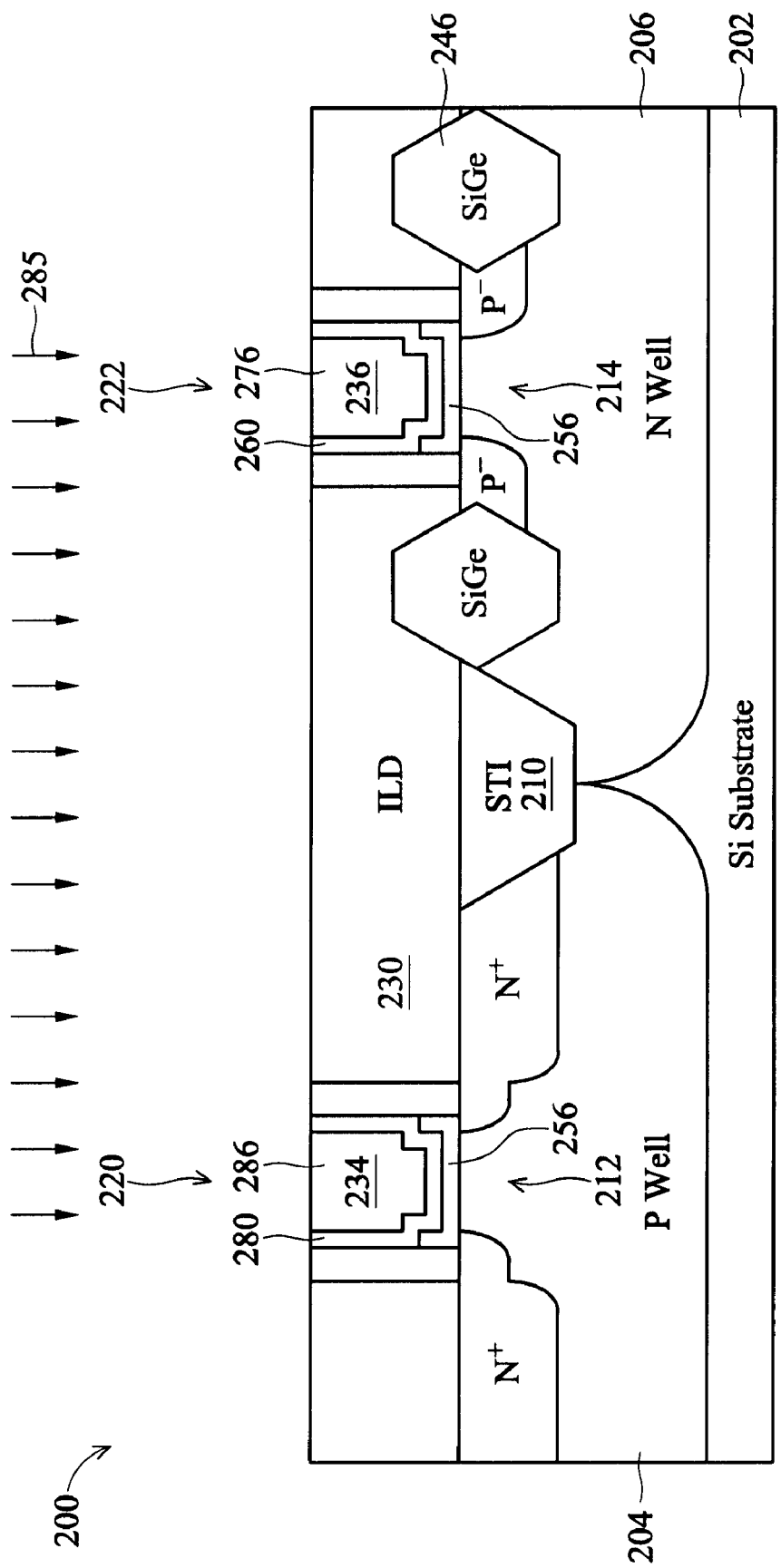

In FIG. 2J, a CMP 285 may be performed on the SOG layer 282 and metal layers 260, 280 to planarize and remove the various layers outside of the trenches 234, 236. The CMP 285 may substantially stop at the ILD layer 230. Further, the CMP 285 may have a high selectivity to provide a substantially planar surface for the gate structures 220, 222 and ILD layer 230. Following the CMP process 285, a SOG layer 286 and N-metal layer 280 remains in the trench 234 of the gate structure 220. It should be noted that the various metal layers and SOG layer outside of the trenches may be removed by a combination CMP and etching process. The remaining SOG layers 276, 286 in the trenches 236, 234, respectively, may be removed by a dry etching process, wet etching process, or combination dry and wet etching process discussed above. For example, a dry etch process may be used to remove the remaining SOG layers 276, 286 in the trenches 236, 234 with an ambient of CHC13, CHBr3, CCl4, CF4, C2F6 at a pressure ranging from 30 to about 100 mT. Alternatively, a wet etching process using a solution of diluted HF (DHF) and solvent may be used to remove the remaining SOG layers 276, 286 in the trenches 236, 234. It should be noted that the high selectivity between the metal layers and SOG layers provides for good control to stop the etching process at the metal layers 260, 280 in the trenches 236, 234, respectively.

Figure 2K:
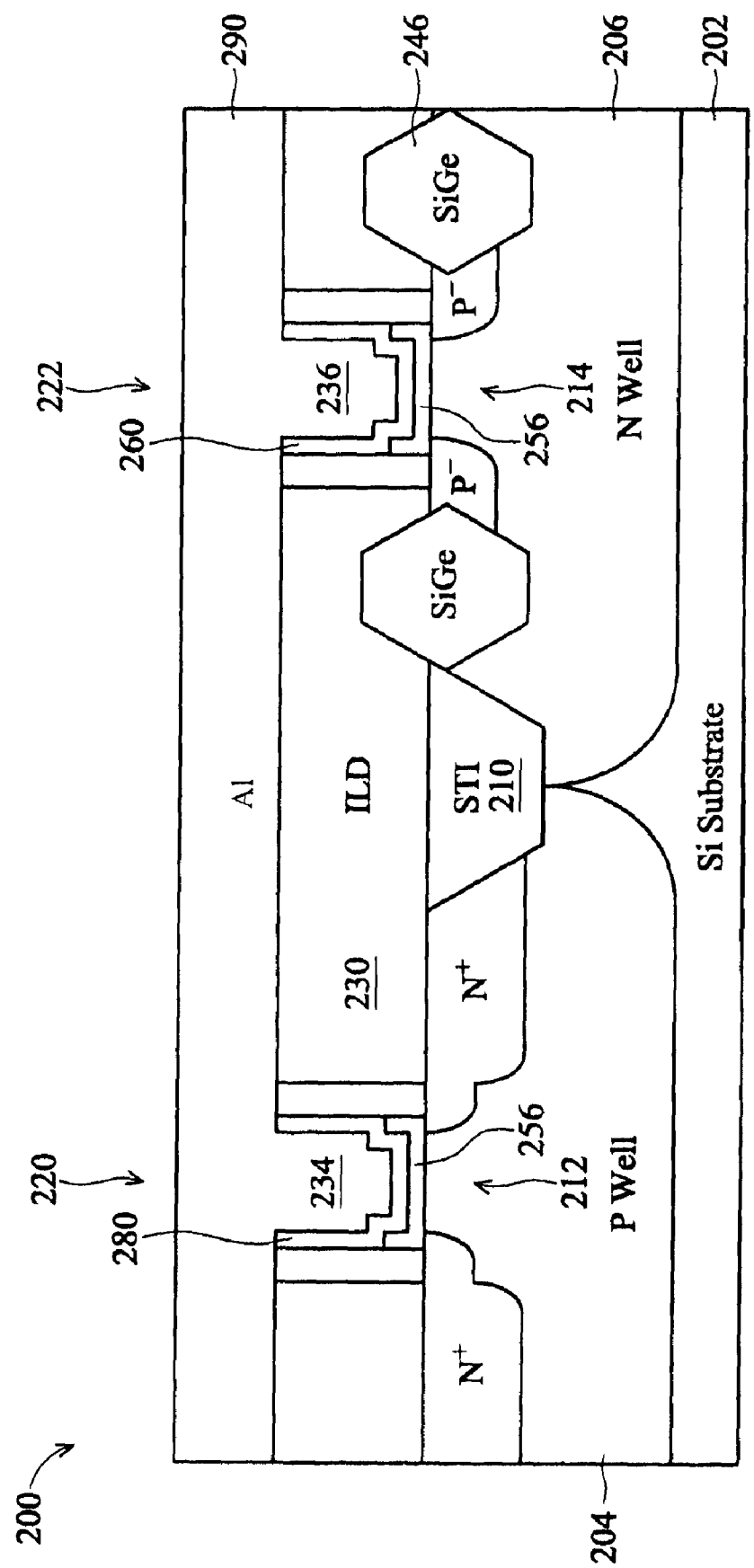

In FIG. 2K, a fill metal 290 may be deposited to fill in the remainder of the trench 234 and in the remainder of the trench 236. In the present embodiment, a layer of titanium (Ti) may be deposited to function as a wetting layer for a subsequent aluminum (Al) fill. The Ti layer may be formed by PVD or other suitable process. A layer of Al 290 may be formed on the Ti layer to fill in the remainder of the trench 234 and in the remainder of the trench 236. The Al layer 290 may be formed by forming a first Al layer by CVD and then forming a second Al layer by PVD. Alternatively, the fill metal 290 may optionally include tungsten (W), copper (Cu), or other suitable metal material.

Figure 2L:
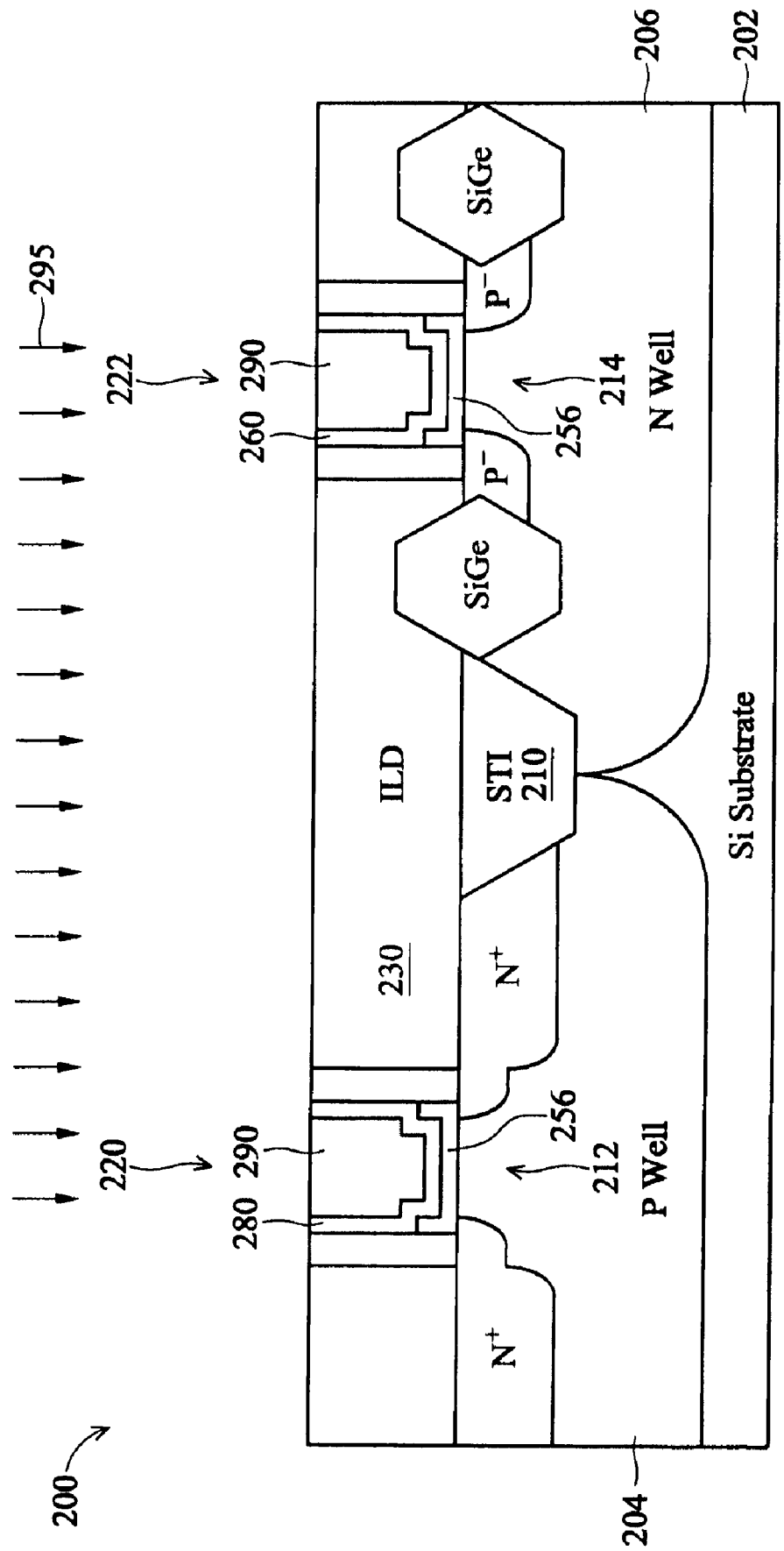

In FIG. 2L, a CMP 295 may be performed on the Al layer 290 to remove the excess Al outside of the trenches 234, 236. Alternatively, the fill metal 290 may optionally include tungsten (W), copper (Cu), or other suitable metal material. The CMP 295 may have a high selectivity to provide a substantially planar surface for the gate structures 220, 222, and ILD layer 230. Accordingly, the metal gate (N-metal layer 280 and Al fill layer 290) of the nFET 212 may perform the proper N work function and the metal gate (P-metal layer 260 and Al fill layer 290) of the pFET 214 may perform the proper P work function. Thus, the desired threshold voltages of the nFET 212 and pFET 214, respectively, may be achieved without added complexity. Further, the quality and integrity of the high-k dielectric layer is maintained since it experiences a lower thermal cycle when formed in a gate last approach. It is understood that the semiconductor device 200 may undergo further processing to form various features such as contacts/vias, interconnect metal layers, interlayer dielectric, passivation layers, etc. It should be noted that the techniques and processes, such as lithography, etching, and high-k/metal gate formation, disclosed above with reference to FIGS. 1 and 2A-2L can also be implemented in the various embodiments disclosed below with reference to FIGS. 3 and 4A-4L, and 5 and 6A-6E.

Figure 3:
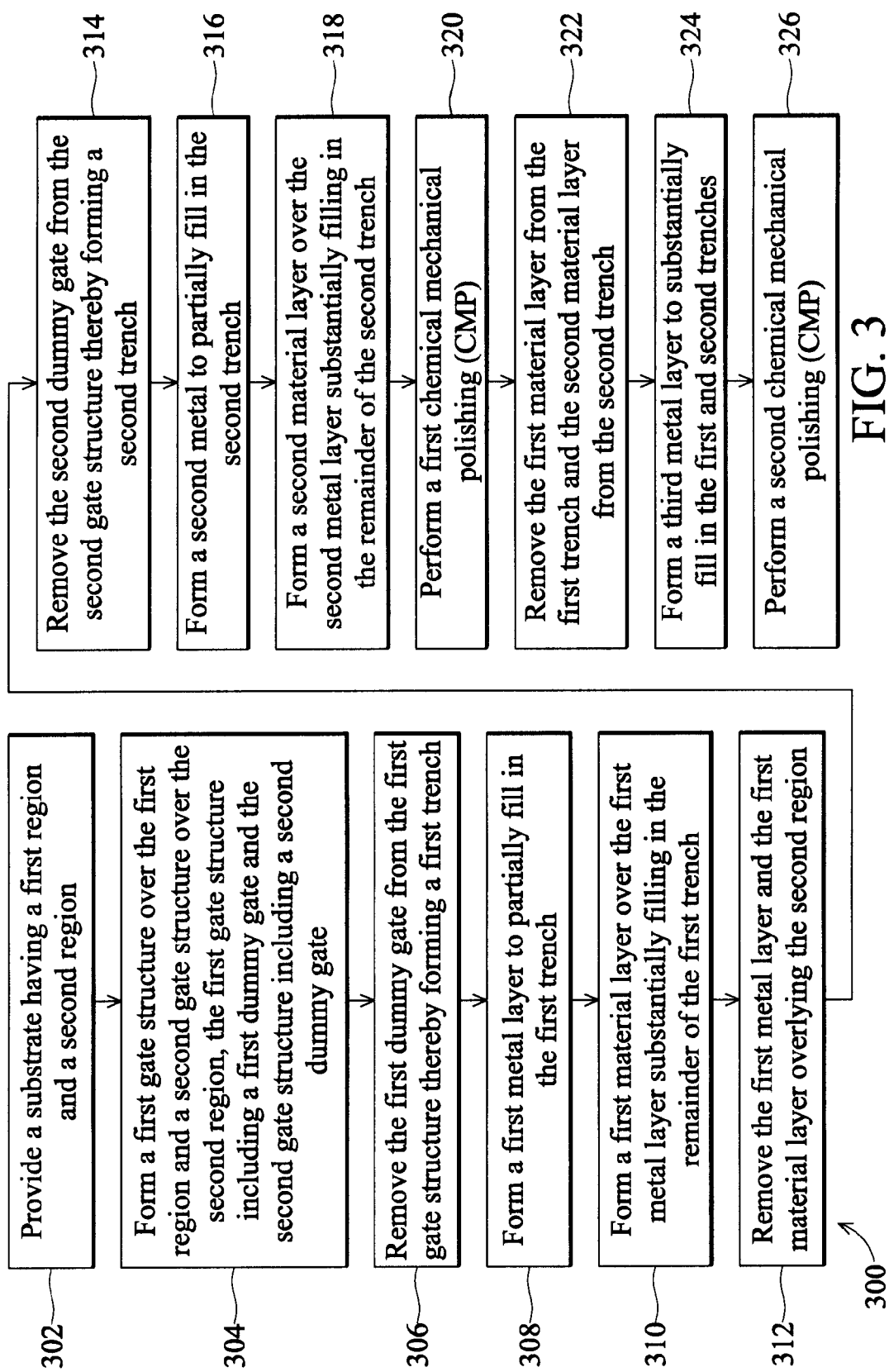
FIG. 3 is a flowchart illustrating a method for fabricating a semiconductor device having metal gates according to various aspects of the present disclosure.

Referring to FIG. 3, illustrated is a flowchart of a method 300 for fabricating a semiconductor device with metal gates according to various aspects of the present disclosure. Referring also to FIGS. 4A to 4L, illustrated are cross-sectional views of a semiconductor device 400 at various stages of fabrication according to the method 300 of FIG. 3. It should be noted that part of the semiconductor device 400 may be fabricated with a CMOS process flow. Accordingly, it is understood that additional processes may be provided before, during, and after the method 300 of FIG. 3, and that some other processes may only be briefly described herein. The semiconductor device 400 may be fabricated in a gate last process. The semiconductor device 400 is similar to the semiconductor device 200 of FIG. 2. Accordingly, similar features in FIGS. 2 and 4 are numbered the same for the sake of simplicity and clarity.

Figure 4A:
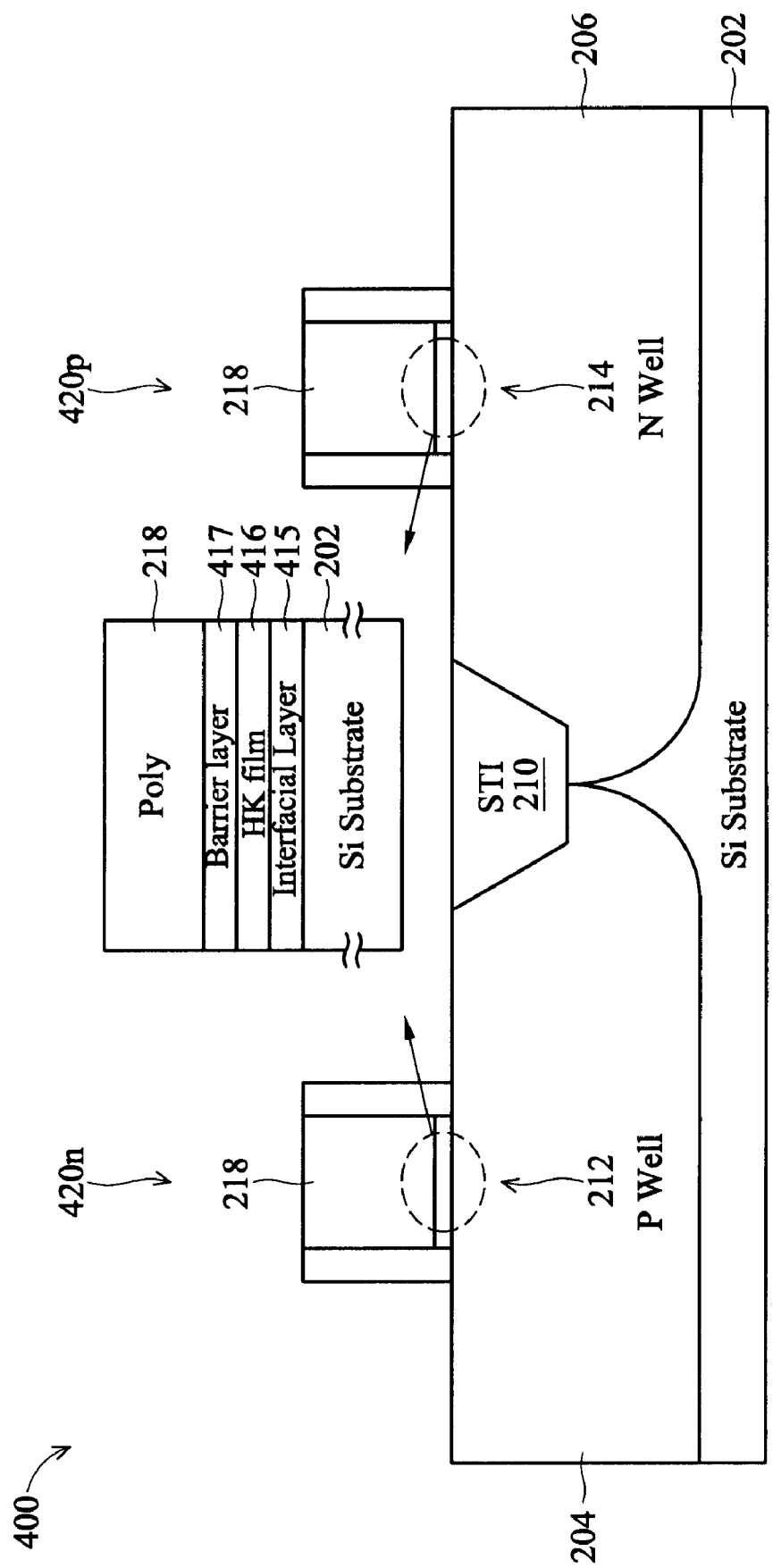
FIGS. 4A to 4L are cross-sectional views of a semiconductor device at various stages of fabrication according to the method of FIG. 3.

The method 300 begins with block 302 in which a semiconductor substrate is provided, the substrate having a first region and a second region. In FIG. 4A, the semiconductor device 400 may include a semiconductor substrate 202 such as a silicon substrate. The substrate 202 may further include doped regions such as a P-well 204 and N-well 206. The semiconductor device 400 may further include an isolation structure 210 such as a shallow trench isolation (STI) or LOCOS feature formed in the substrate 202 for isolating active regions 212 and 214 of the substrate. The active region 212 may be configured for an NMOS device (e.g., nFET) and the active region 214 may be configured for a PMOS device (e.g., pFET).

The method 300 continues with block 304 in which a first gate structure is formed over the first region and a second gate structure is formed over the second region, the first gate structure including a first dummy gate and the second gate structure including a second dummy gate. The formation of the gate structures includes forming various material layers, and etching/patterning the various material layers to form a gate structure in the nFET 212 device side and a gate structure in the pFET 214 device side as discussed below.

The semiconductor device 400 includes an interfacial layer 415 formed over the substrate 202. The interfacial layer 415 may include a silicon oxide ($SiO_2$) layer (e.g., thermal or chemical oxide formation) having a thickness ranging from about 5 to about 20 angstrom (A). Alternatively, the interfacial layer 415 may optionally include HfSiO or SiON formed by atomic layer deposition (ALD), chemical vapor deposition (CVD), physical vapor deposition (PVD), thermal oxidation, or combinations thereof. In some embodiments, an Hf film may be formed on a thermal oxide by ALD, CVD, or PVD, and then oxidized by thermal $O_2$ to form HfSiO. In other embodiments, an Hf film may be formed by ALD, CVD, or PVD in a reactive $O_2$ ambient.

The semiconductor device 400 further includes a high-k dielectric layer 416 formed on the interfacial layer 415. The high-k dielectric layer 416 may be formed by ALD, CVD, metalorganic CVD (MOCVD), PVD, thermal oxidation, combinations thereof, or other suitable techniques. The high-k dielectric layer 416 may include a thickness ranging from about 5 to about 20 angstrom (A). The high-k dielectric layer 416 may include a binary or ternary high-k film such as $HfO_x$. Alternatively, the high-k dielectric layer 416 may optionally include other high-k dielectrics such as LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides, or other suitable materials.

The semiconductor device 400 may further include a barrier layer 417 formed over the high-k dielectric layer 416. The barrier layer 417 may include a metal film such as TiN or TaN. Alternatively, the barrier layer 417 may optionally include $Si_3N_4$. The barrier layer 417 may include a thickness ranging from about 5 to about 20 angstrom (A). The barrier layer 417 may function as a barrier between the high-k dielectric layer 416 and a subsequent dummy poly gate structure. The barrier layer 417 may help reduce or eliminate the risk of Fermi level pinning between the poly and the high-k dielectric 416 during subsequent processing. Also, the barrier layer 417 may function as a etch stop layer and protection layer during removal of the dummy poly gate as discussed later below. The barrier layer 417 may be formed by various deposition techniques such as ALD, PVD, CVD, or other suitable technique. It should be noted that the interfacial layer 415, high-k dielectric 416, and barrier layer 417 may be alternatively formed in a gate last process as was discussed in FIGS. 1 and 2.

The semiconductor device 400 may further include a polysilicon (or poly) layer 218 formed over the barrier layer 417 by a suitable deposition process. For example, silane ($SiH_4$), di-silane ($Si_2H_6$), or di-clorsilane ($SiCl_2H_4$) may be used as a chemical gas in a CVD process to form the poly layer 218. The poly layer 218 may include a thickness ranging from about 200 to about 2000 angstrom (A). Alternatively, an amorphous silicon layer may optionally be formed instead of the polysilicon layer. The semiconductor device 400 may further include a hard mask layer (not shown) formed on the poly layer 218. The hard mask layer may include silicon oxide, silicon nitride, silicon oxynitride, silicon carbide, and/or other suitable dielectric materials, and may be formed using a method such as CVD or PVD. The hard mask layer may include a thickness ranging from about 100 to about 400 angstrom (A). Additionally, an antireflective coating layer or bottom antireflective coating (BARC) layer may be used to enhance a photolithography process for patterning a photoresist layer. For example, a patterned photoresist layer (not shown) may be formed on the hard mask layer including a gate pattern overlying the nFET 212 device side and a gate pattern overlying the pFET 214 device side. The gate patterns may be used to pattern the hard mask layer by a dry etch or wet etch process.

The patterned hard mask may then be used to form the gate structure 420n in the nFET 212 device side and a gate structure 420p in the pFET 214 device side by a dry etch, wet etch, or combination dry and wet etch process. Accordingly, the gate structures 420n, 420p may each includes an interfacial layer 415, high-k dielectric layer 416, a barrier layer 417, a dummy poly gate 218, and a hard mask.

Figure 4B:
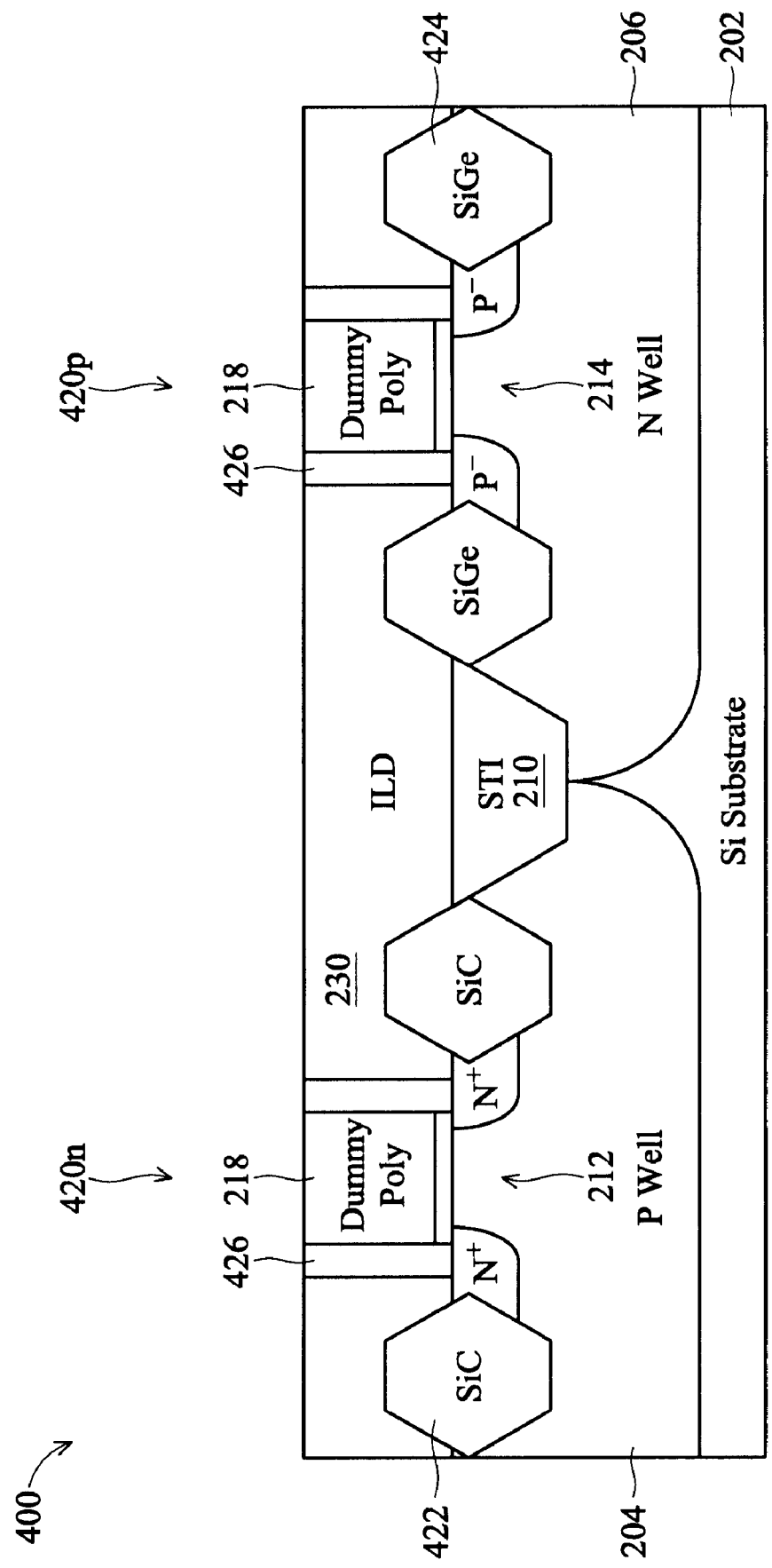

After formation of the gate structures 420n, 420p (e.g., gate etching or patterning), it is understood that the semiconductor device 400 may undergo additional CMOS processing to form various features of the nFET 212 and pFET 214. Accordingly, the various features are only briefly discussed herein. In FIG. 4B, the various features may include SiC features 422 in the nFET 212 side, SiGe 424 features in the pFET 214 side, lightly doped source/drain regions (n-type and p-type LDD regions), sidewall or gate spacers 426, source/drain (S/D) regions (n-type and p-type S/D regions), silicide features, contact etch stop layer (CESL), and an interlayer dielectric (ILD) 230. It should be noted that the SiC features 422 and SiGe features 424 are optional, and that a strained layer may be implemented for the nFET 212 device and/or the pFET 214 device to boost the performance of the device. The ILD 230 may include an oxide formed by a high aspect ratio process (HARP) and/or high density plasma (HDP) CVD process. The deposition of the ILD 230 fills in the gaps between the adjacent gate structures 420n, 420p of the nFET 212 and pFET 214 devices, respectively. Thereafter, a chemical mechanical polishing (CMP) process may be performed on the ILD 230 to planarize the ILD until the dummy poly gates 218 are exposed in the nFET 212 side and pFET 214 side, respectively.

Figure 4C:
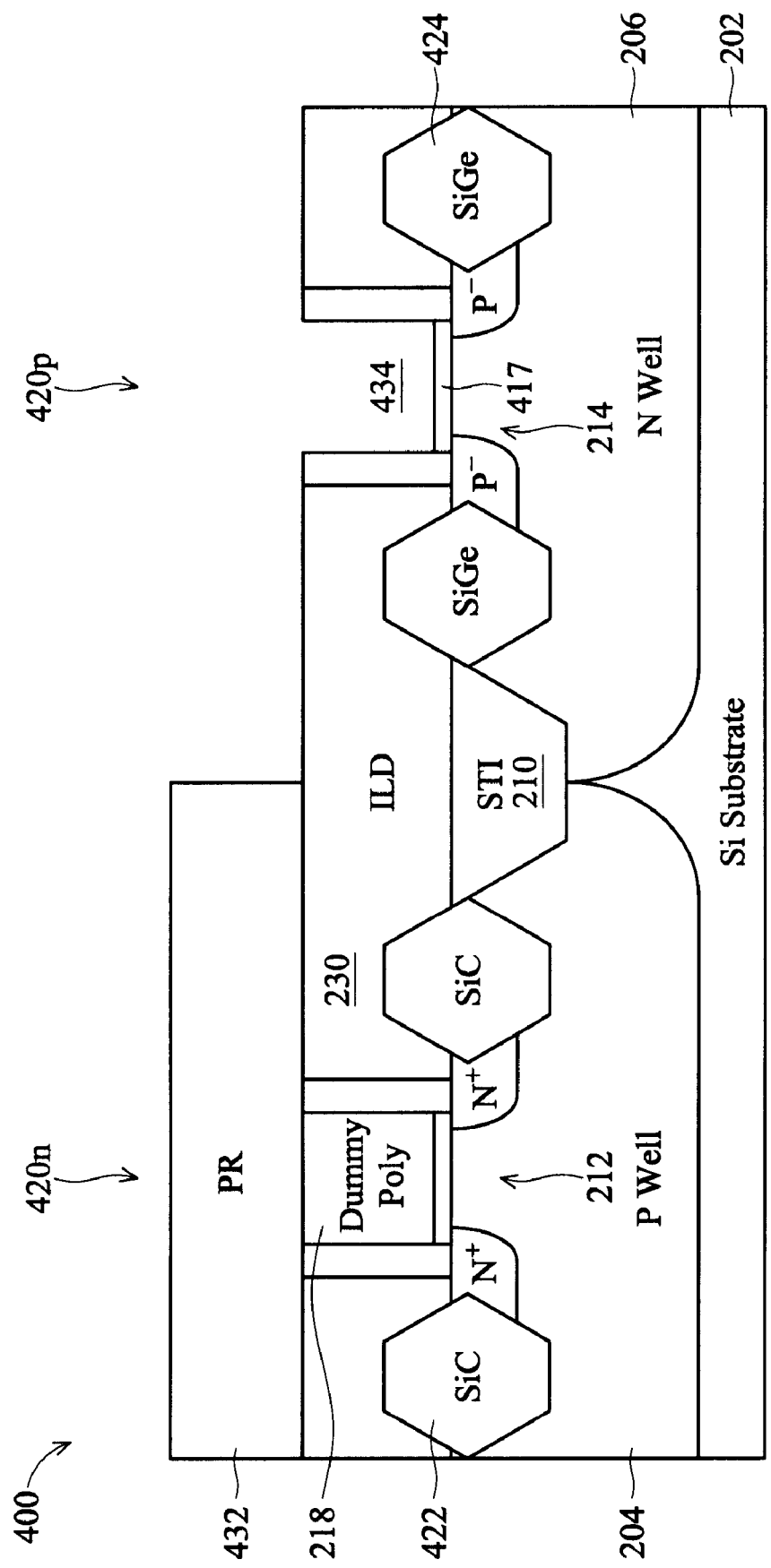

The method 300 continues with block 306 in which the first dummy gate is removed from the first gate structure thereby forming a first trench. In FIG. 4C, a patterned photoresist layer 432 is formed to protect the gate structure 420n in the nFET 212 side. The patterned photoresist layer 432 may be formed by photolithography, immersion lithography, ion-beam writing, or other suitable techniques. For example, the photolithography process may include spin-coating, soft-baking, exposure, post-baking, developing, rinsing, drying, and other suitable process. The dummy poly gate 218 in the gate structure 420p of the pFET 214 side may be removed by a dry etching, wet etching, or combination dry and wet etching process. For example, a wet etching process may include exposure to a hydroxide containing solution (e.g., ammonium hydroxide), de-ionized water, and/or other suitable etchant solutions. It should be noted that the barrier layer 417 in the gate structure 420p may function as an etch stop or barrier for the etching process. The dummy poly gate 218 may be selectively etched thereby forming a trench 434 in the gate structure 420p in the pFET 214 side. The patterned photoresist layer 432 may be removed by stripping or other suitable process.

Figure 4D:
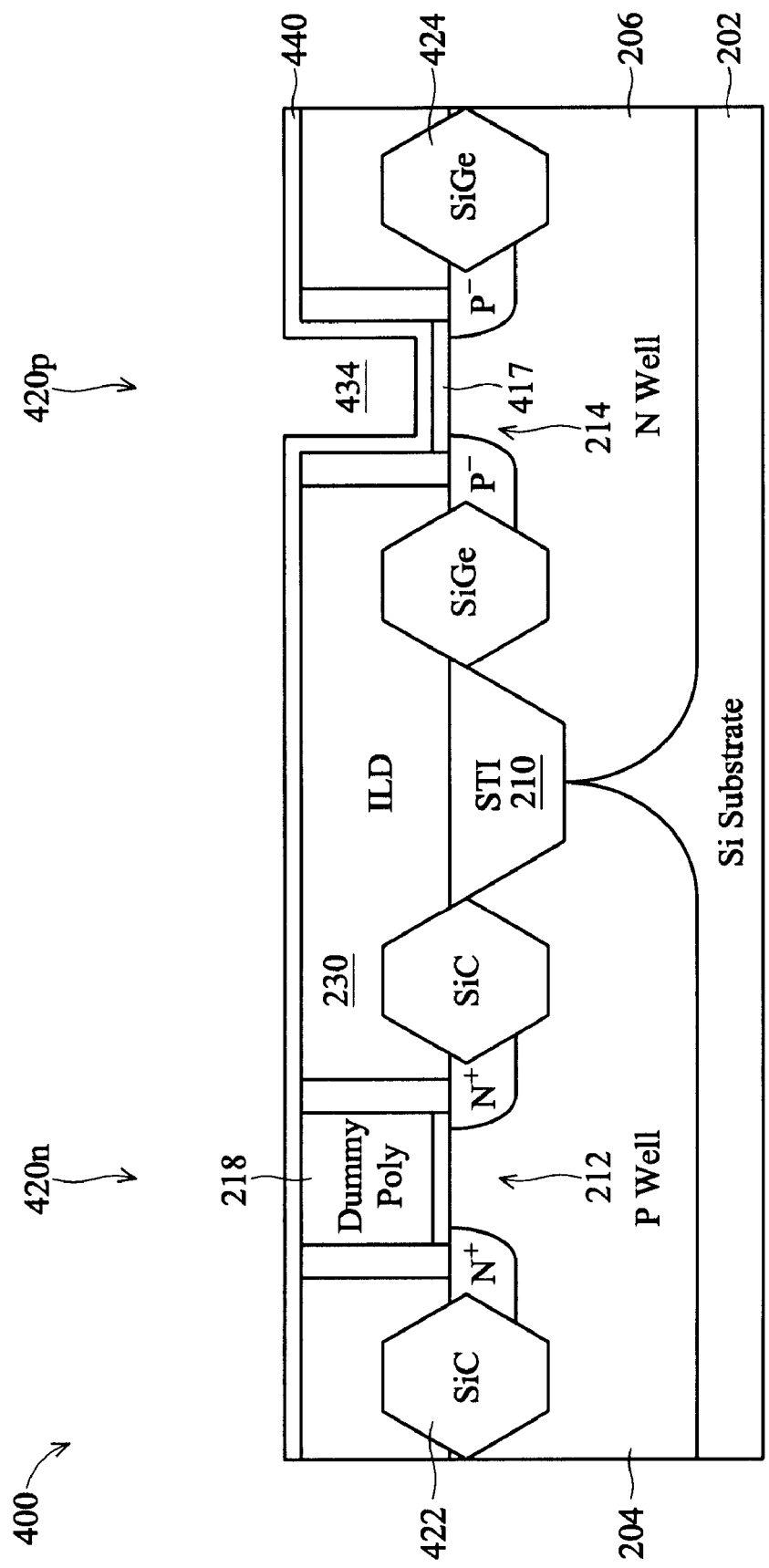

The method 300 continues with block 308 in which a first metal layer is formed to partially fill in the first trench. In FIG. 4D, a work function metal layer may be formed to partially fill in the trench 434 in the pFET 214 side. In the present embodiment, a P-type work function metal (P-metal) 440 may be formed over the barrier layer 417 of the gate structure 420p, and may fill in a portion of the trench 434. The P-metal 440 may include a layer of TiN and may have a thickness ranging from about 10 to about 100 angstrom (A). The P-metal layer 440 may be formed by ALD, PVD, CVD, or other suitable process. Alternatively, the P-metal layer 440 may optionally include other suitable metals, such as WN, TaN, or Ru, that properly perform in the pFET 214. Further, the P-metal layer 440 may also include a multi-metal layer structure such as TiN/WN.

Figure 4E:
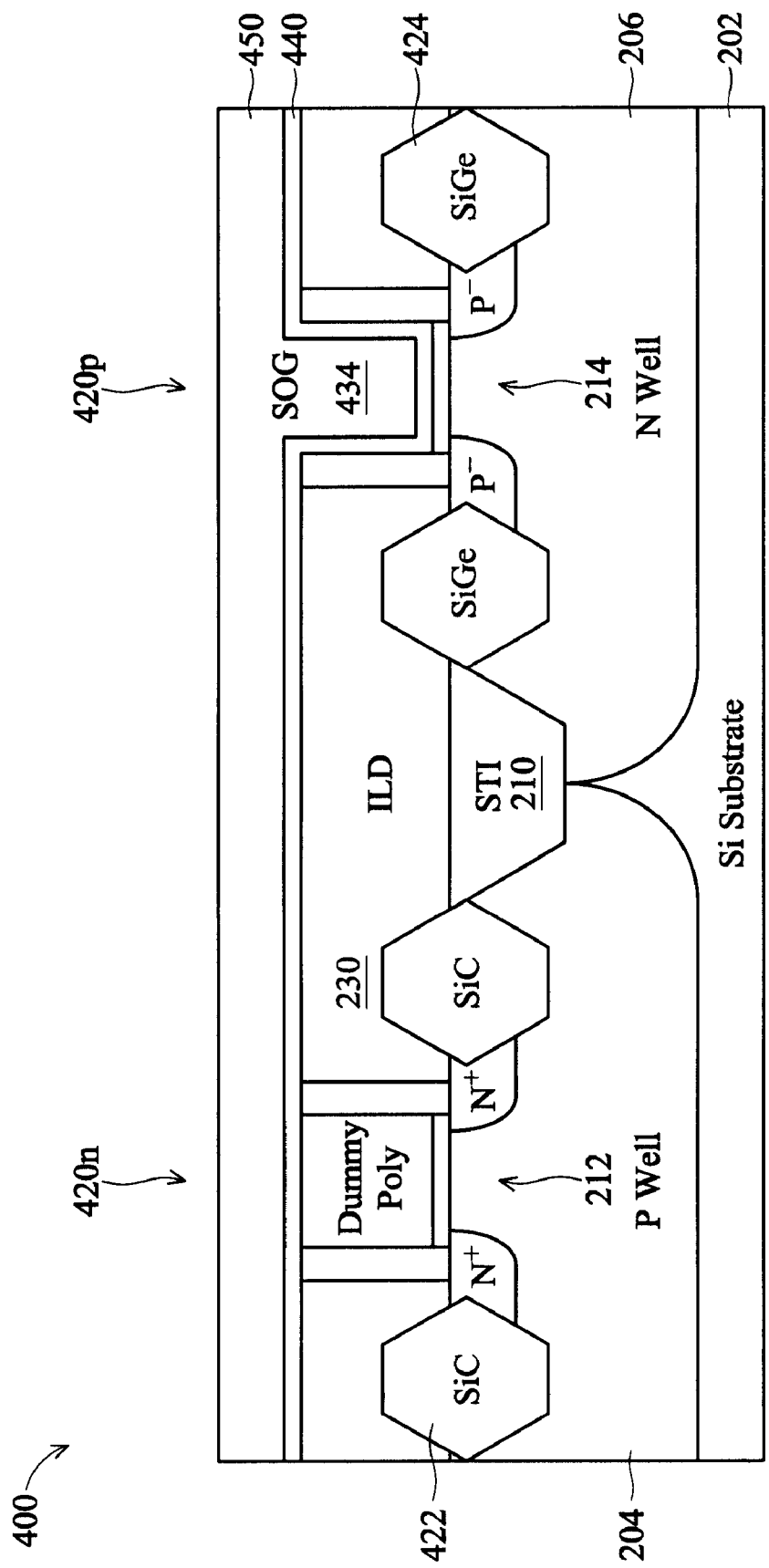

The method 300 continues with block 310 in which a first material layer is formed over the first metal layer substantially filling in the remainder of the first trench. In FIG. 4E, a material layer 450 may be formed on the P-metal layer 440 by a spin-on or spin-coating process. For example, the material layer 450 may include a spin-on-glass (SOG). The SOG layer 450 may substantially fill in the remainder of the trench 434. It should be noted that the SOG is capable of filling in small gaps, and thus the risk of forming voids in the trench 434 may be minimized. Further, a high etching selectivity between the SOG layer 450 and metal layer 440 provides for better process control during subsequent patterning of the metal layers as discussed below. Moreover, the SOG layer 450 is able to withstand encroachment of a metal etching chemical during subsequent patterning of the metal layers. Alternatively, the material layer 450 may include other materials that are suitable for filling in trench 434 and adhering to the underlying P-metal layer 440. For example, the material layer 450 may optionally include a polymer, ceramic (with a low melting point), liquid crystal, and other dielectric materials. The polymer and ceramic materials may include polymer resins and metal oxides, respectively, that are typically used in semiconductor manufacturing.

Figure 4F:
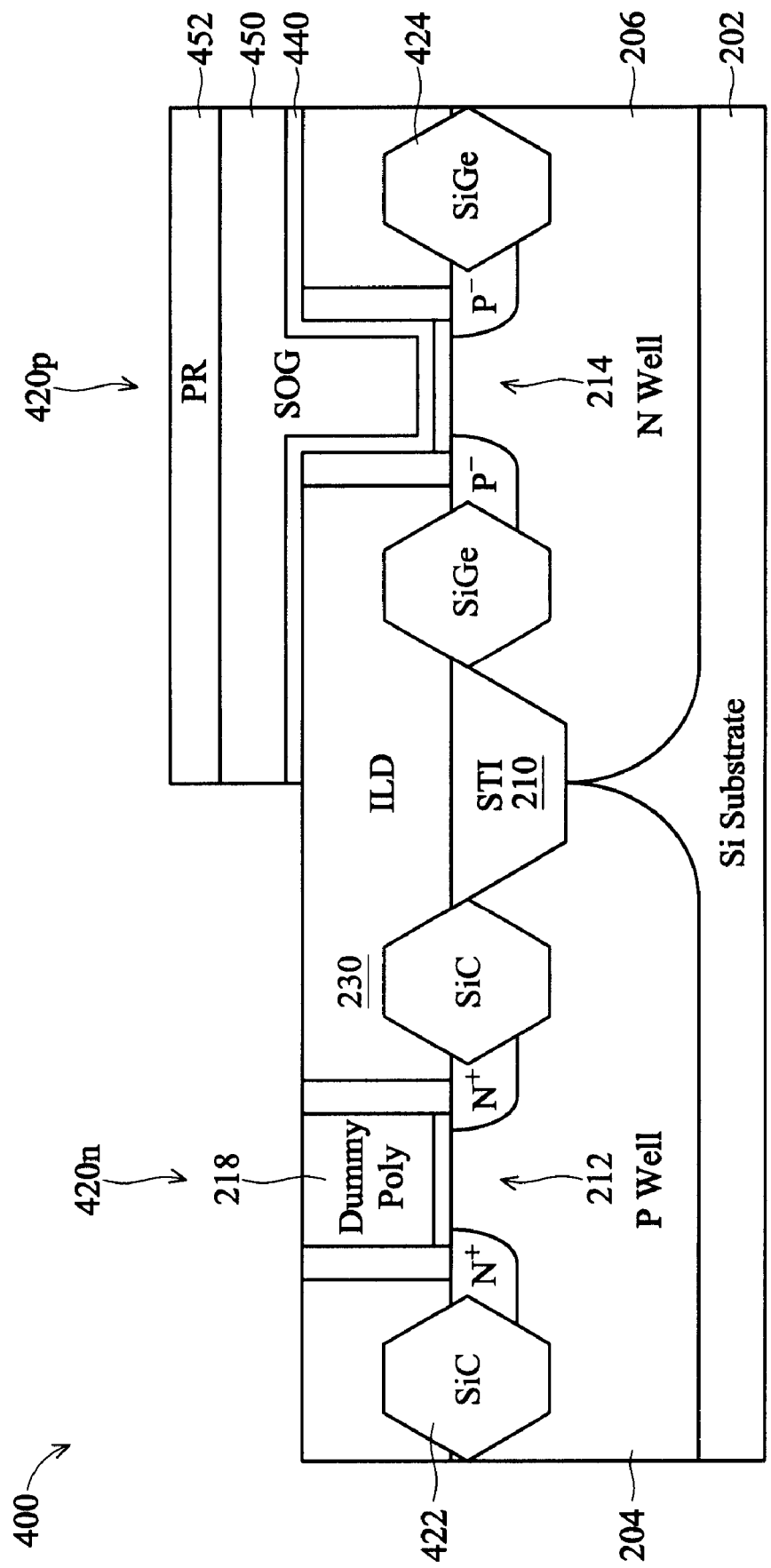

The method 300 continues with block 312 in which the first metal layer and the first material layer overlying the second region are removed. In FIG. 4F, a patterned photoresist layer 452 may be formed to protect the SOG layer 450 and P-metal layer 440 in the pFET 214 side. The patterned photoresist layer 452 may be formed on the SOG layer 450 by a similar process that was used to form the photoresist layer 432 discussed above. The unprotected SOG layer 450 and P-metal layer 440 in the nFET 212 side may be removed by a dry etching process, a wet etching process, or combination wet and dry etching process. Additionally, the etching may be performed by a single etching step or multiple step etching process. For example, a dry etch process may be used to remove the unprotected SOG layer 450 with an ambient of $CHCl_3$, $CHBr_3$, $CCl_4$, $CF_4$, $C_2F_6$ at a pressure ranging from 30 to about 100 mT. Alternatively, a wet etching process using a solution of diluted HF (DHF) and solvent may be used to remove the unprotected SOG layer 450. Further, a wet etching process using a solution of $NH_4OH:H_2O_2$:de-ionzied water or other suitable etchant may be used to selectively remove the P-metal layer 440. The patterned photoresist layer 452 may be removed by a stripping process or other suitable process. Alternatively, the SOG layer 450 and P-metal layer 440 in the nFET 212 side may be removed by a single wet etching process.

Figure 4G:
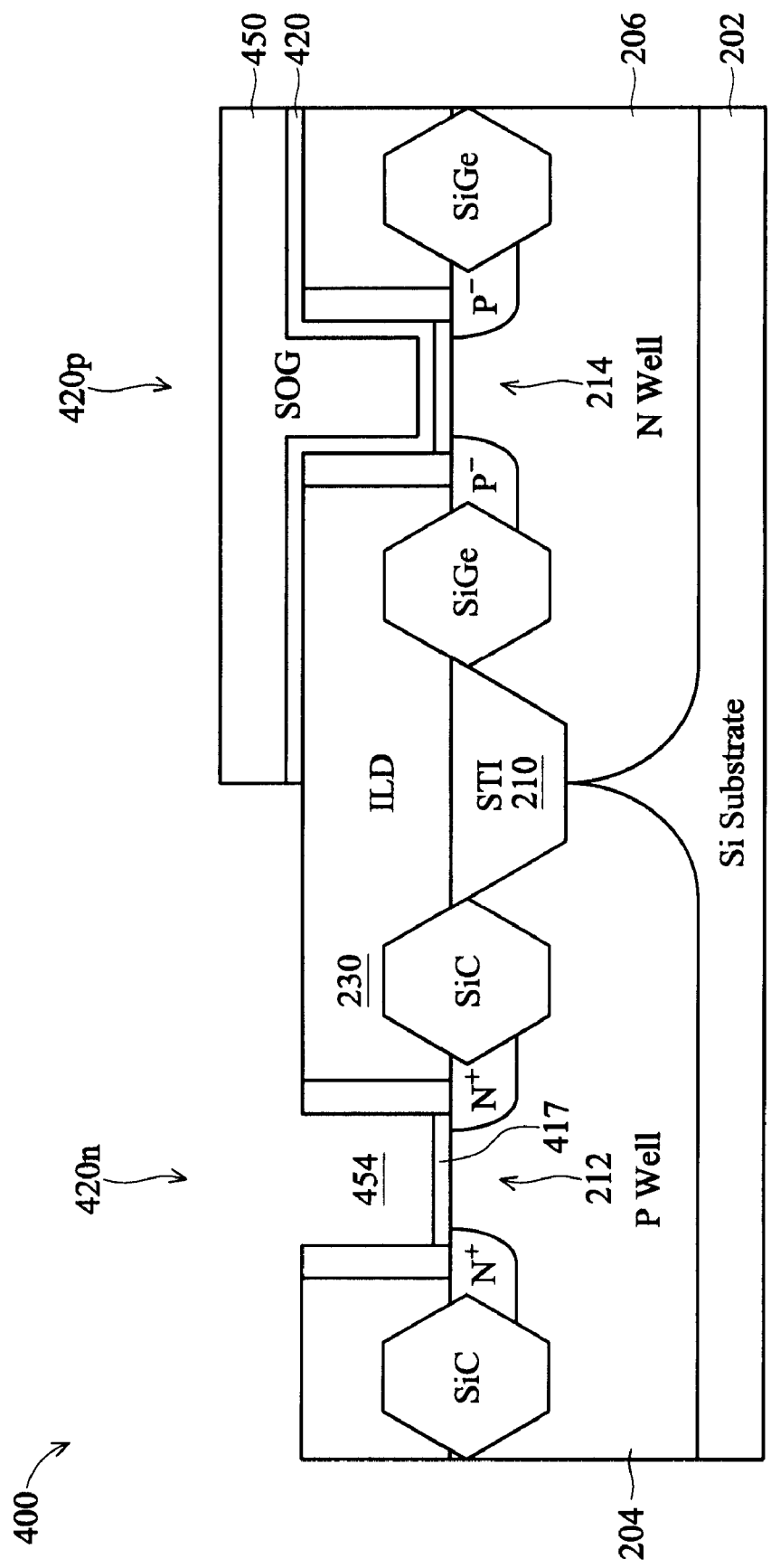

The method 300 continues with block 314 in which the second dummy gate is removed from the second gate structure thereby forming a second trench. In FIG. 4G, the dummy poly gate 218 in the gate structure 420n of the nFET 212 may be removed by a dry etching, wet etching, or combination dry and wet etching process. For example, a wet etching process may include exposure to a hydroxide containing solution (e.g., ammonium hydroxide), de-ionized water, and/or other suitable etchant solutions. It should be noted that the barrier layer 417 in the gate structure 420n may function as an etch stop or barrier for the etching process. The dummy poly gate 218 may be selectively etched thereby forming a trench 454 in the gate structure 420n of the nFET 212 side. The patterned photoresist layer 452 may be removed by stripping or other suitable process.

Figure 4H:
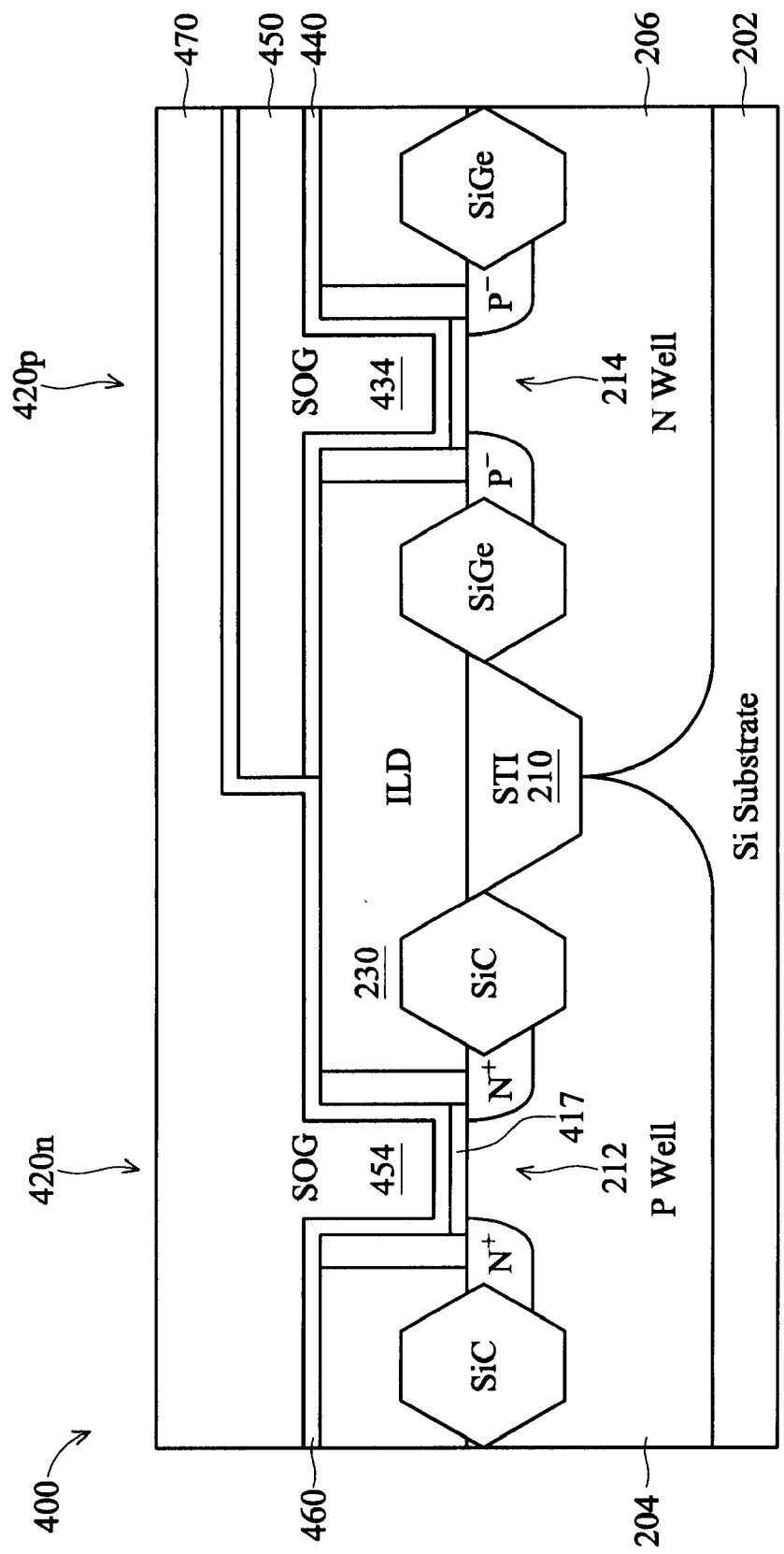

The method 300 continues with block 316 in which a second metal layer is formed to partially fill in the second trench. In FIG. 4H, a work function metal layer may be formed to partially fill in the trench 454 in the nFET 212 side. In the present embodiment, an N-type work function metal (N-metal) 460 may be formed over the barrier layer 417 of the gate structure 420n, and may fill in a portion of the trench 454. The N-metal 460 may include a layer of TiAl and may have a thickness ranging from about 10 to about 100 angstrom (A). The N-metal layer 460 may be formed by ALD, PVD, CVD, or other suitable process. Alternatively, the N-metal layer 460 may optionally include other suitable metals, such as Ti, Ag, Al, TiAlN, TaC, TaCN, TaSiN, Mn, or Zr that properly perform in the nFET 212. Further, the N-metal layer 460 may also include a multi-metal layer structure.

The method 300 continues with block 318 in which a second material layer is formed over the second metal layer substantially filling in the remainder of the second trench. Still referring to FIG. 4H, a material layer 470 may be formed over the N-metal layer 460 by a spin-on or spin-coating process. In the present embodiment, the material layer 470 may be formed of the same material as the material layer 450. The material layer 470 may include a spin-on-glass (SOG). The SOG layer 470 may substantially fill in the remainder of the trench 454. It should be noted that the SOG is capable of filling in small gaps, and thus the risk of forming voids in the trench 454 may be minimized. Further, a high etching selectivity between the SOG layers 450, 470 and metal layers 440, 460 provides for better process control during subsequent patterning of the metal layers as discussed below. Moreover, the SOG layer 470 is able to withstand encroachment of a metal etching chemical during subsequent patterning of the metal layers. Alternatively, the material layer 470 may optionally include other dielectric materials that are suitable for filling in the trench 454 and adhering to the underlying N-metal layer 460 during subsequent processing. For example, the material layer 470 may optionally include a polymer, ceramic (with a low melting point), liquid crystal, and other dielectric materials. The polymer and ceramic may include polymer resins and metal oxides, respectively, that are typically used in semiconductor manufacturing.

Figure 4I:
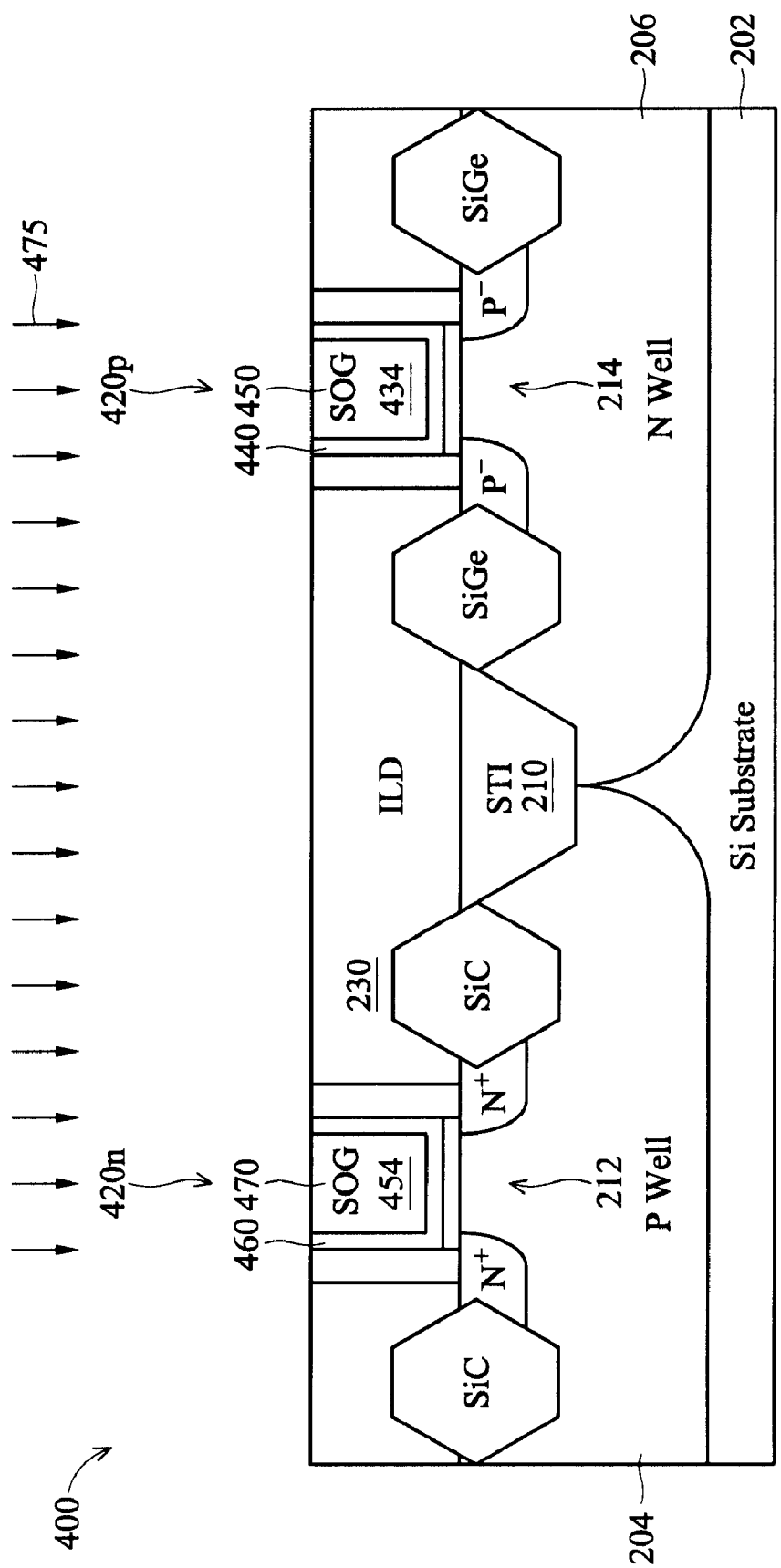

The method 300 continues with block 320 in which a first chemical mechanical polishing (CMP) may be performed. In FIG. 4I, a CMP 475 may be performed on the various metal layers 440, 460 and SOG layers 450, 470 to planarize and remove the various layers outside of the trenches 434, 454. The CMP 475 may substantially stop at the ILD layer 230. Further, the CMP 475 may have a high selectivity to provide a substantially planar surface for the gate structures 420n, 420p and ILD layer 230.

Alternatively, the various metal layers 440, 460 and SOG layers 450, 470 may be removed by a combination CMP and etching process. For example, a CMP process may be performed on the SOG layer 470 that substantially stops at the N-metal layer 460. It should be noted that the high selectivity between the metal layer and SOG layer provides for good control to stop the CMP at the metal layer 460. A dry etching process may then be implemented to remove the N-metal layer 460 and may substantially stop at the SOG layers 450, 470. The dry etching process may be similar to the one used for removing a portion of the P-metal layer 440 discussed above. Again, the high selectivity between the metal layer and SOG layer provides for good control to stop the etching process at the SOG layer. The remaining SOG layers 450, 470 and metal layers 440, 460 may be removed by another CMP process and/or etching process that stops at the ILD layer 230. It is understood that other various combinations of CMP, dry etching, and wet etching may be used to remove the various layers outside of the trenches 434, 454.

Figure 4J:
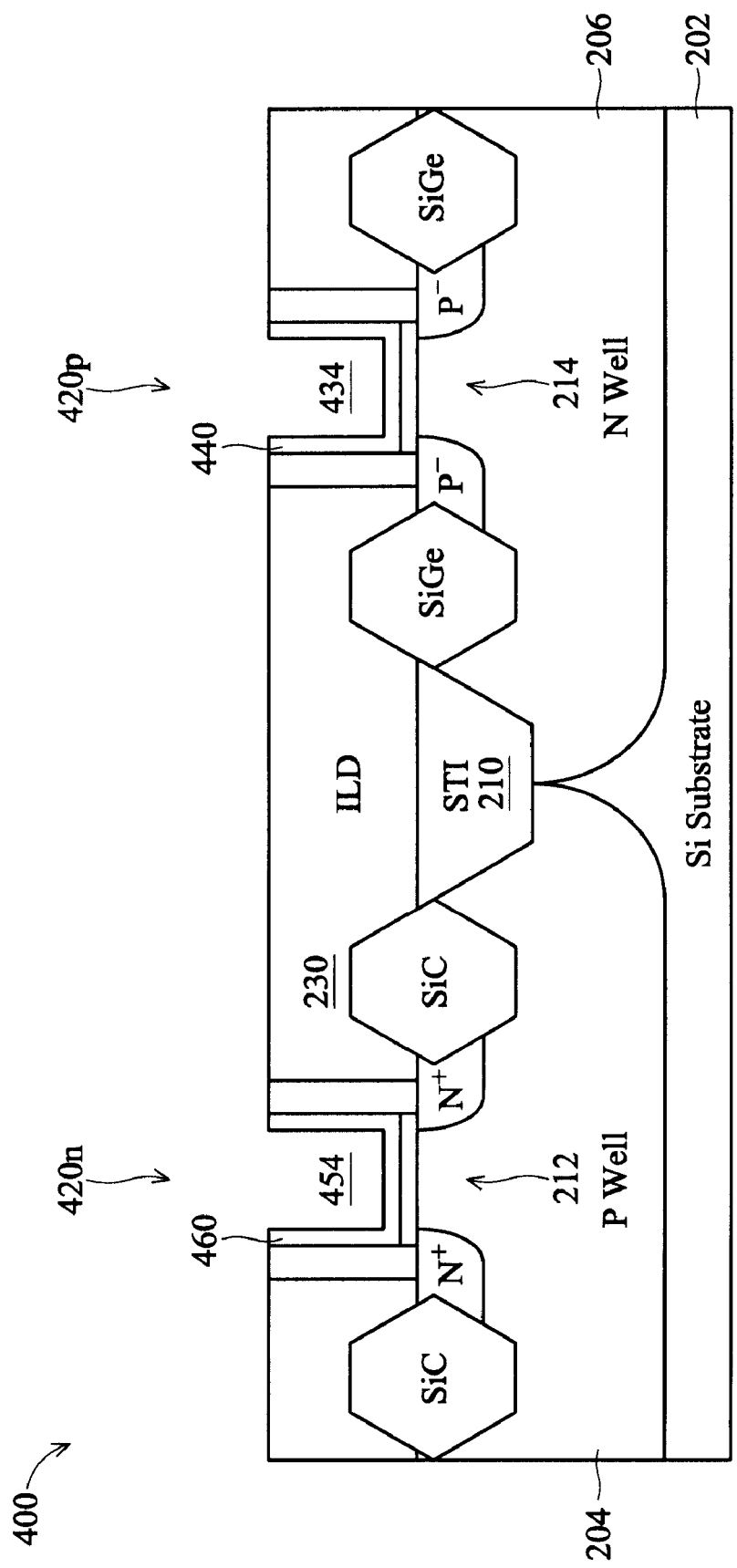

The method 300 continues with block 322 in which the first material layer is removed from the first trench and the second material layer is removed from the second trench. In FIG. 4J, the remaining SOG layers 450, 470 in the trenches 434, 454, respectively may be removed by a dry etching process, wet etching process, or combination dry and wet etching process discussed above. For example, a dry etch process may be used to remove the remaining SOG layers 450, 470 in the trenches 434, 454 with an ambient of CHCl$_3$, CHBr$_3$, CCl$_4$, CF$_4$, C$_2$F$_6$ at a pressure ranging from 30 to about 100 mT. Alternatively, a wet etching process using a solution of diluted HF (DHF) and solvent may be used to remove the remaining SOG layers 450, 470 in the trenches 434, 454. It should be noted that the high selectivity between the metal layers and SOG layers provides for good control to stop the etching process at the metal layers 440, 460 in the trenches 434, 454, respectively.

Figure 4K:
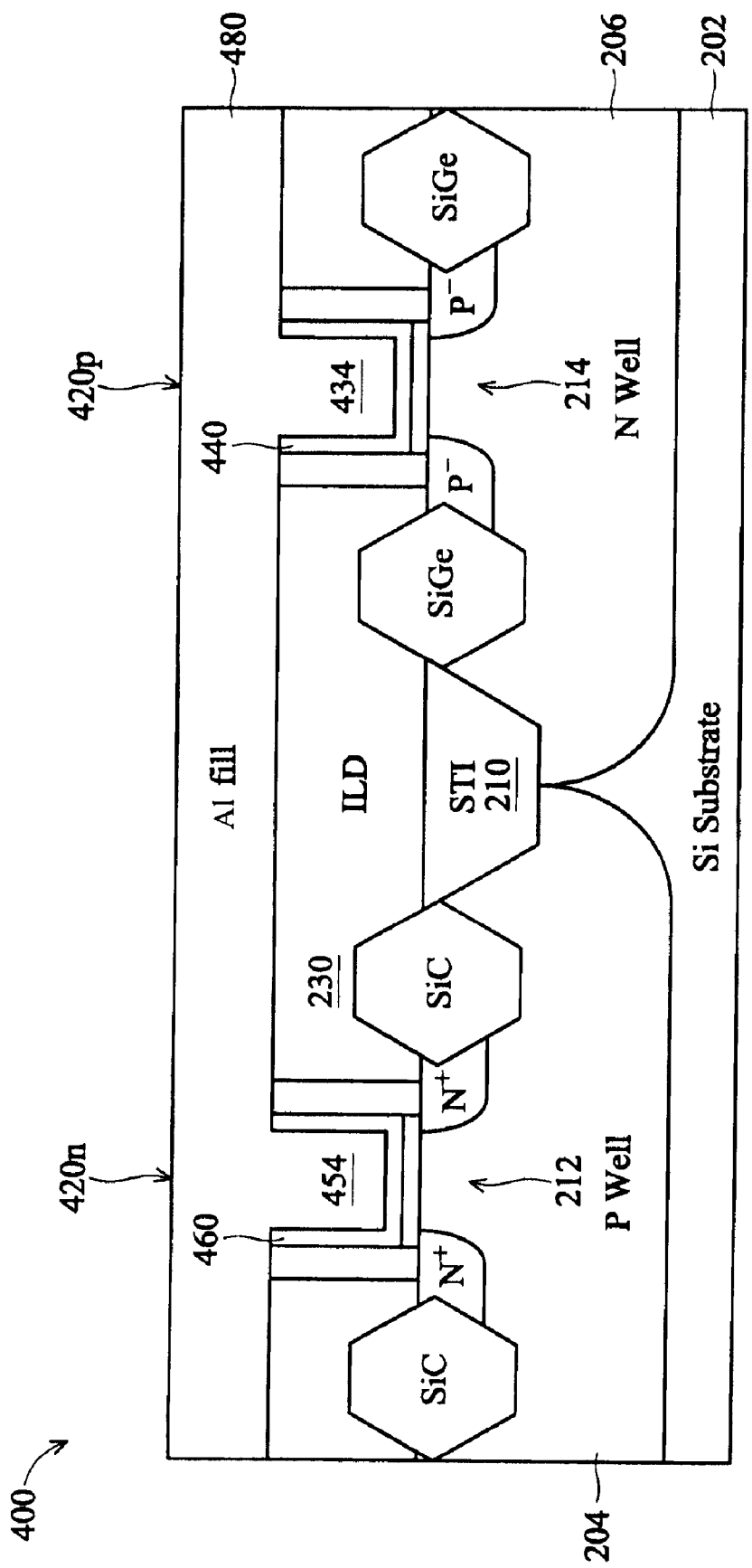

The method 300 continues with block 324 in which a third metal layer is formed to substantially fill in the remainder of the first and second trenches. In FIG. 4K, a fill metal 480 may be deposited to fill in the remainder of the trench 434 and in the remainder of the trench 454. In the present embodiment, a layer of titanium (Ti) may be deposited to function as a wetting layer for a subsequent aluminum (Al) fill. The Ti layer may be formed by PVD or other suitable process. A layer of Al 480 may be formed on the Ti layer to fill in the remainder of the trench 434 and in the remainder of the trench 454. The Al layer 480 may be formed by forming a first Al layer by CVD and then forming a second Al layer by PVD. Alternatively, the fill metal 480 may optionally include tungsten (W), copper (Cu), or other suitable metal material.

Figure 4L:
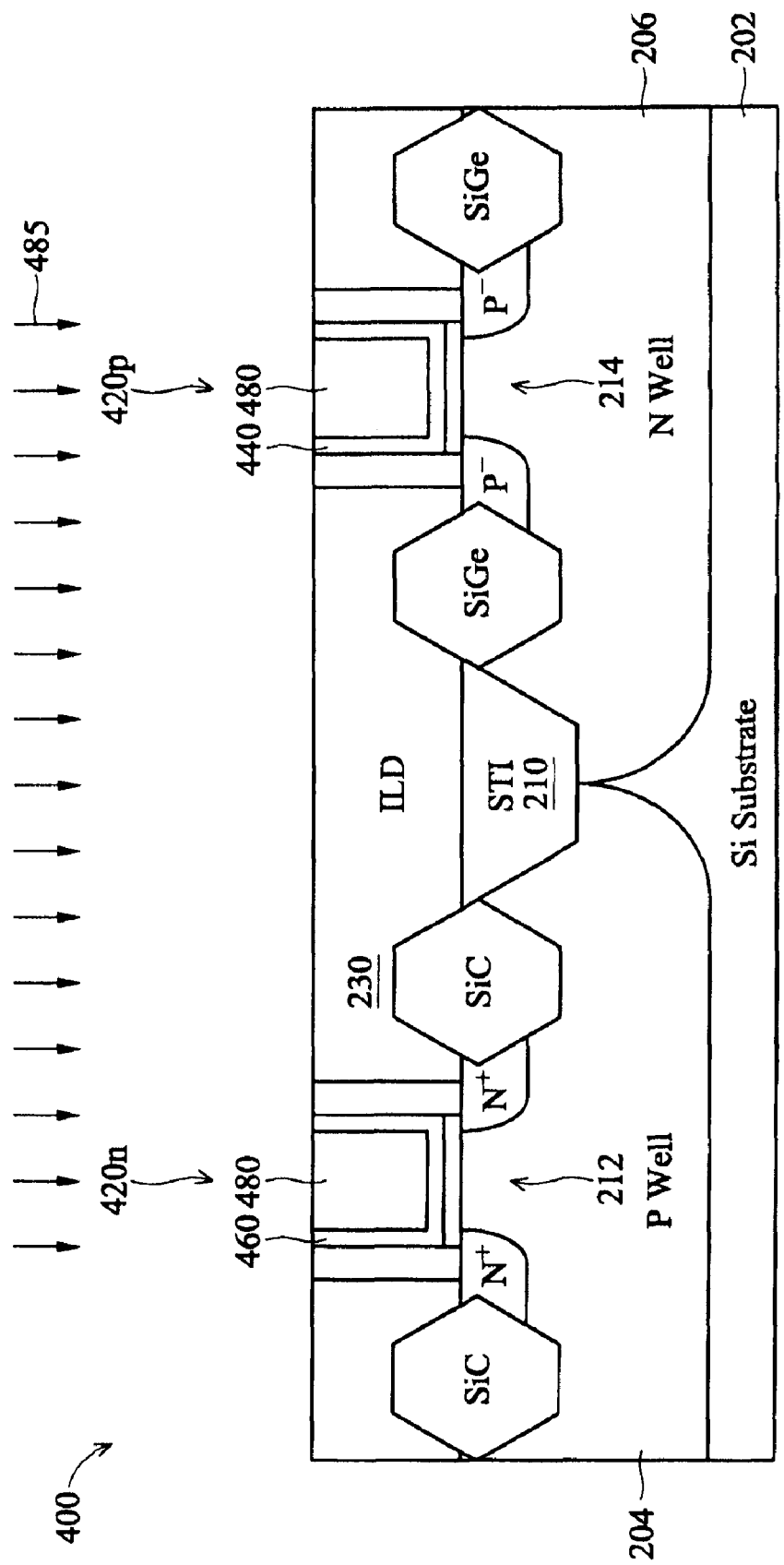

The method 300 continues with block 326 in a second CMP process is performed. In FIG. 4L, a CMP 485 may be performed on the Al layer 480 to remove the excess Al outside of the trenches 434, 454. The CMP 485 may have a high selectivity to provide a substantially planar surface for the gate structures 420n, 420p, and ILD layer 230. Accordingly, the metal gate (N-metal layer 460 and Al fill layer 480) of the nFET 212 may perform the proper N work function and the metal gate (P-metal layer 440 and Al fill layer 480) of the pFET 214 may perform the proper P work function. Thus, the desired threshold voltages of the nFET 212 and pFET 214, respectively, may be achieved without added complexity.

It is understood that the semiconductor device 400 may undergo further processing to form various features such as contacts/vias, interconnect metal layers, interlayer dielectric, passivation layers, etc. Further, although the method 300 discloses forming the P-metal layer first and forming the N-metal layer second, it is understood that the method 300 may be used to form the N-metal layer first and the P-metal layer second in a similar manner. It should be noted that the techniques and processes disclosed with reference to FIGS. 3 and 4A-4L can also be implemented in the embodiments of FIGS. 1 and 2A-2L disclosed above, and the embodiments disclosed below with reference to FIGS. 5 and 6A-6E.

Figure 5:
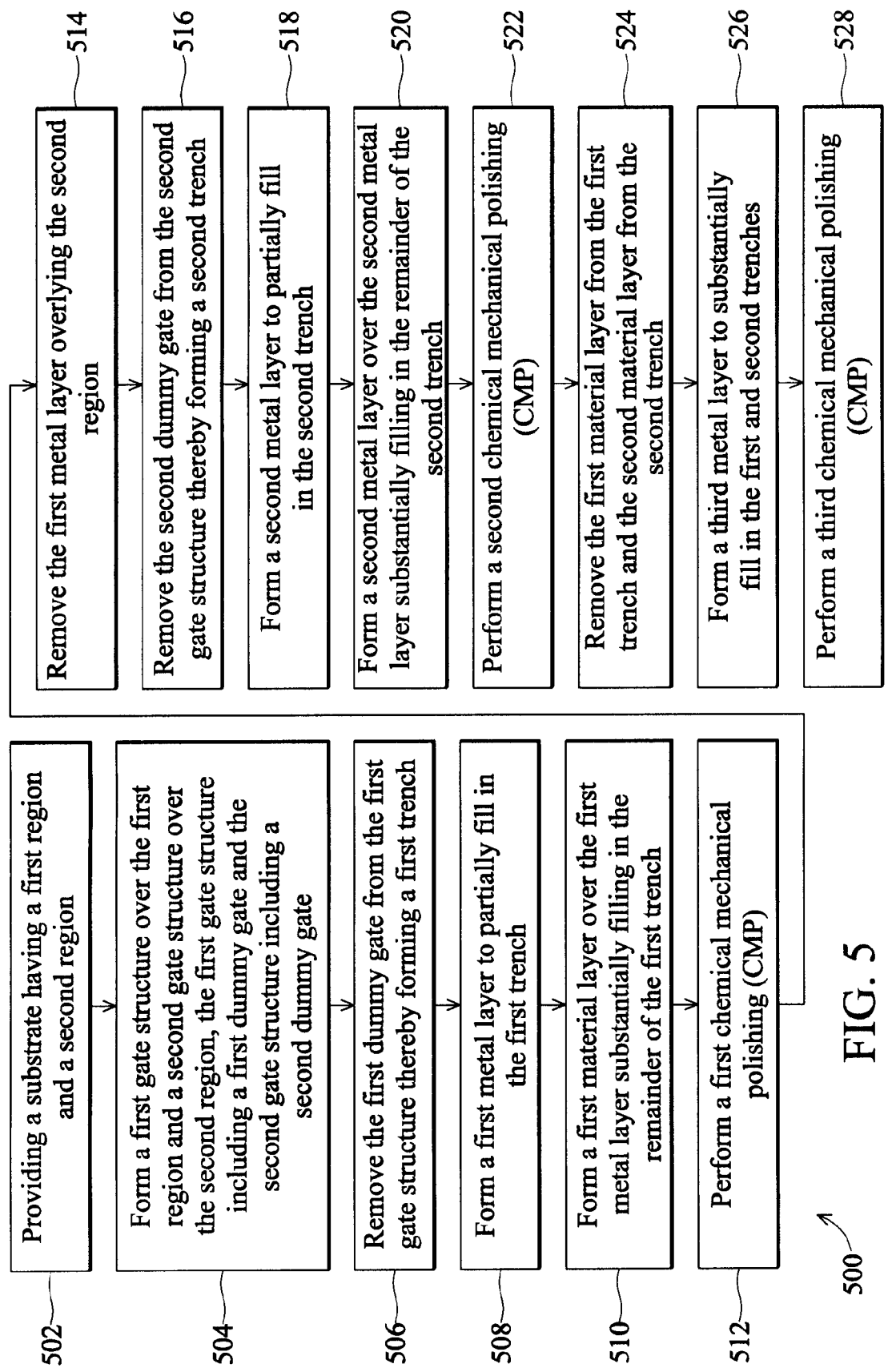
FIG. 5 is a flowchart illustrating an alternative method for fabricating a semiconductor device having metal gates according to various aspects of the present disclosure.

Referring to FIG. 5, illustrated is a flowchart of an alternative method 500 for fabricating a semiconductor device with metal gates according to various aspects of the present disclosure. Referring also to FIGS. 6A to 6E, illustrated are cross sectional views of a semiconductor device 600 at various stages of fabrication according to the method 500 of FIG. 5. The semiconductor device 600 is similar to the semiconductor device 400 of FIG. 4. Accordingly, similar features in FIGS. 4 and 6 are numbered the same for the sake of simplicity and clarity. Further, the method 500 may include similar processes that were discussed in the method 300 of FIG. 3. For example, the method 500 includes blocks 502, 504, 506, 508, 510 which are similar to blocks 302, 304, 306, 308, 310, respectively, of the method 300 in FIG. 3.

Figure 6A:
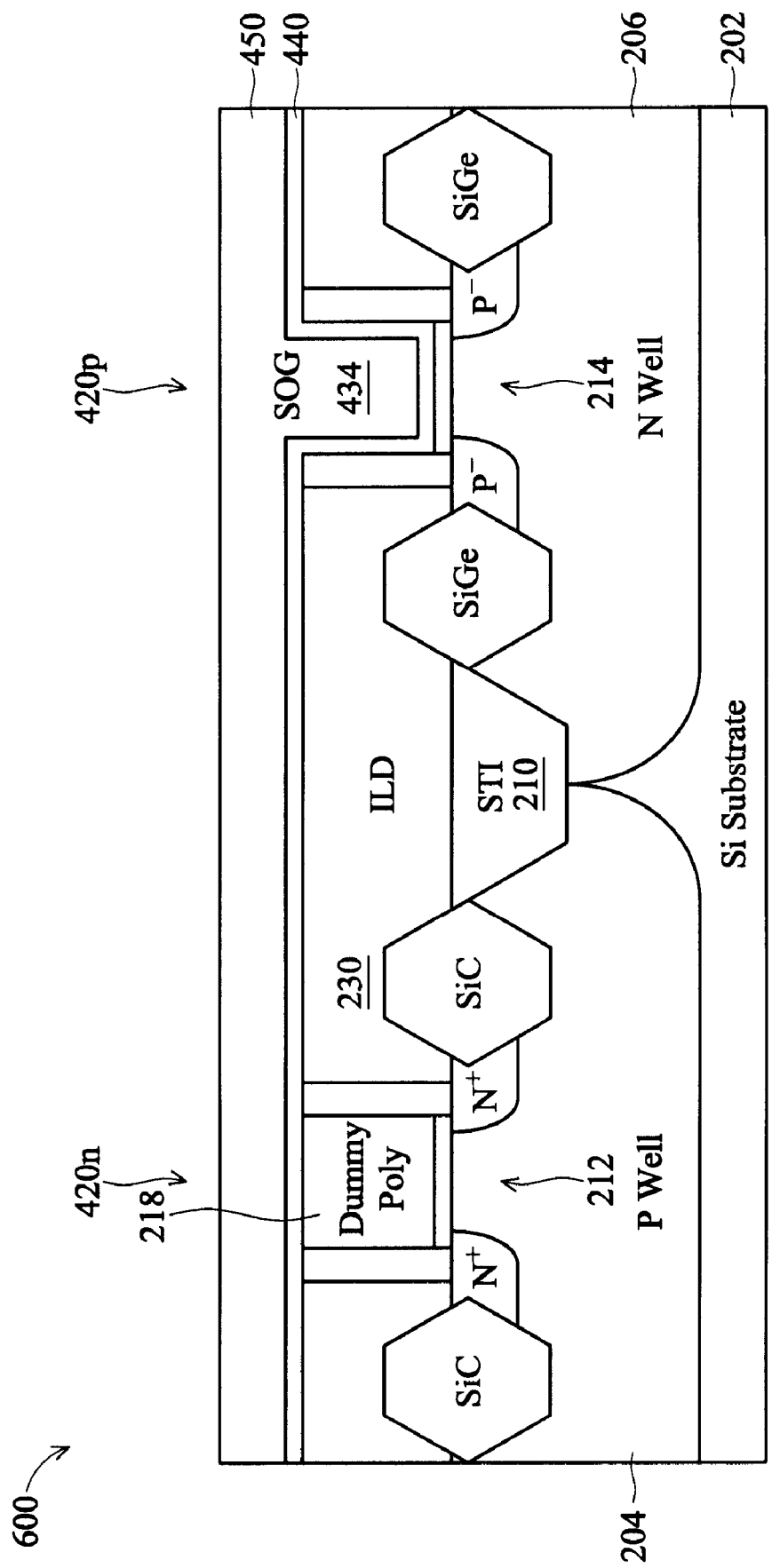
FIGS. 6A to 6E are cross-sectional views of a semiconductor device at various stages of fabrication according to the method of FIG. 5.

In FIG. 6A, the semiconductor device 600 is illustrated following the process discussed in block 510 which is similar to the process discussed in block 310 of method 300 which was illustrated in FIG. 4E. In the present embodiment, a P-type work function metal (P-metal) 440 may be formed over the barrier layer 417 of the gate structure 420p, and may fill in a portion of the trench 434. The P-metal 440 may include a layer of TiN and may have a thickness ranging from about 10 to about 100 angstrom (A). The P-metal layer 440 may be formed by ALD, PVD, CVD, or other suitable process. Alternatively, the P-metal layer 440 may optionally include other suitable metals, such as WN, TaN, or Ru, that properly perform in the pFET 214. Further, the P-metal layer 440 may also include a multi-metal layer structure such as TiN/WN.

A material layer 450 may be formed on the P-metal layer 440 by a spin-on or spin-coating process. For example, the material layer 450 may include a spin-on-glass (SOG). The SOG layer 450 may substantially fill in the remainder of the trench 434. It should be noted that the SOG is capable of filling in small gaps, and thus the risk of forming voids in the trench 434 may be minimized. Further, a high etching selectivity between the SOG 250 and metal layer 440 provides for better process control during subsequent patterning of the metal layers as discussed below. Moreover, the SOG layer 450 is able to withstand encroachment of a metal etching chemical during subsequent patterning of the metal layers. Alternatively, the SOG layer 450 may include other materials that are suitable for filling in trench 434 and adhering to the underlying P-metal layer 440 during subsequent processing as discussed below. For example, the material layer may optionally include a polymer, ceramic (with a low melting point), liquid crystal, and other dielectric materials. The polymer and ceramic may include polymer resins and metal oxides, respectively, that are typically used in semiconductor manufacturing.

Figure 6B:
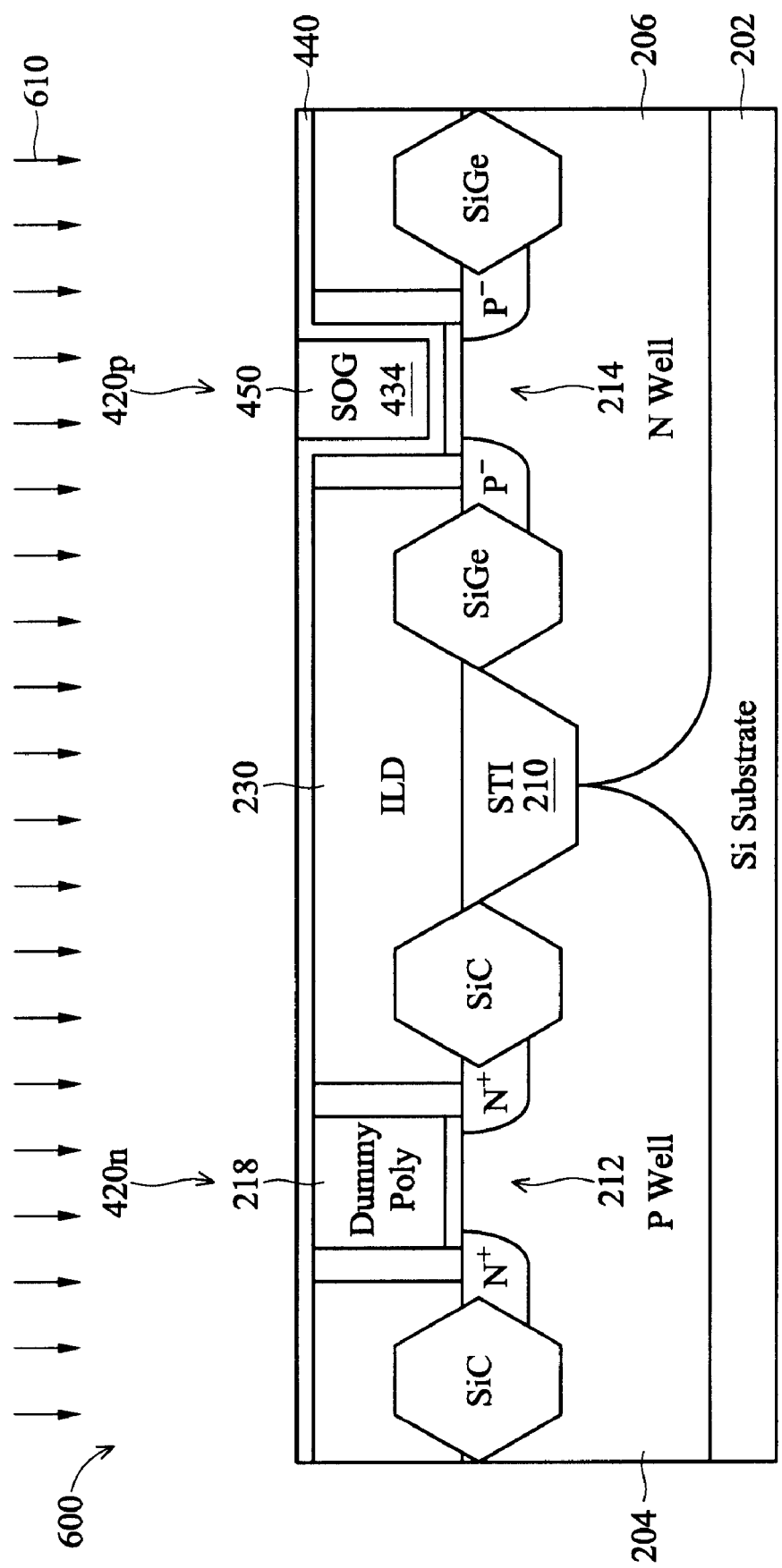

The method 500 continues with block 512 in which a first chemical mechanical polishing (CMP) may be performed. In FIG. 6B, a CMP 610 may be performed on the SOG layer 450 that substantially stops at the P-metal layer 440. It should be noted that the high selectivity between the metal layer and SOG layer provides for good control to stop the CMP 610 at the metal layer 440. Following the CMP 610, a portion of the SOG layer 450 remains in the trench 434 of the gate structure 420p in the pFET 214 device side.

Figure 6C:
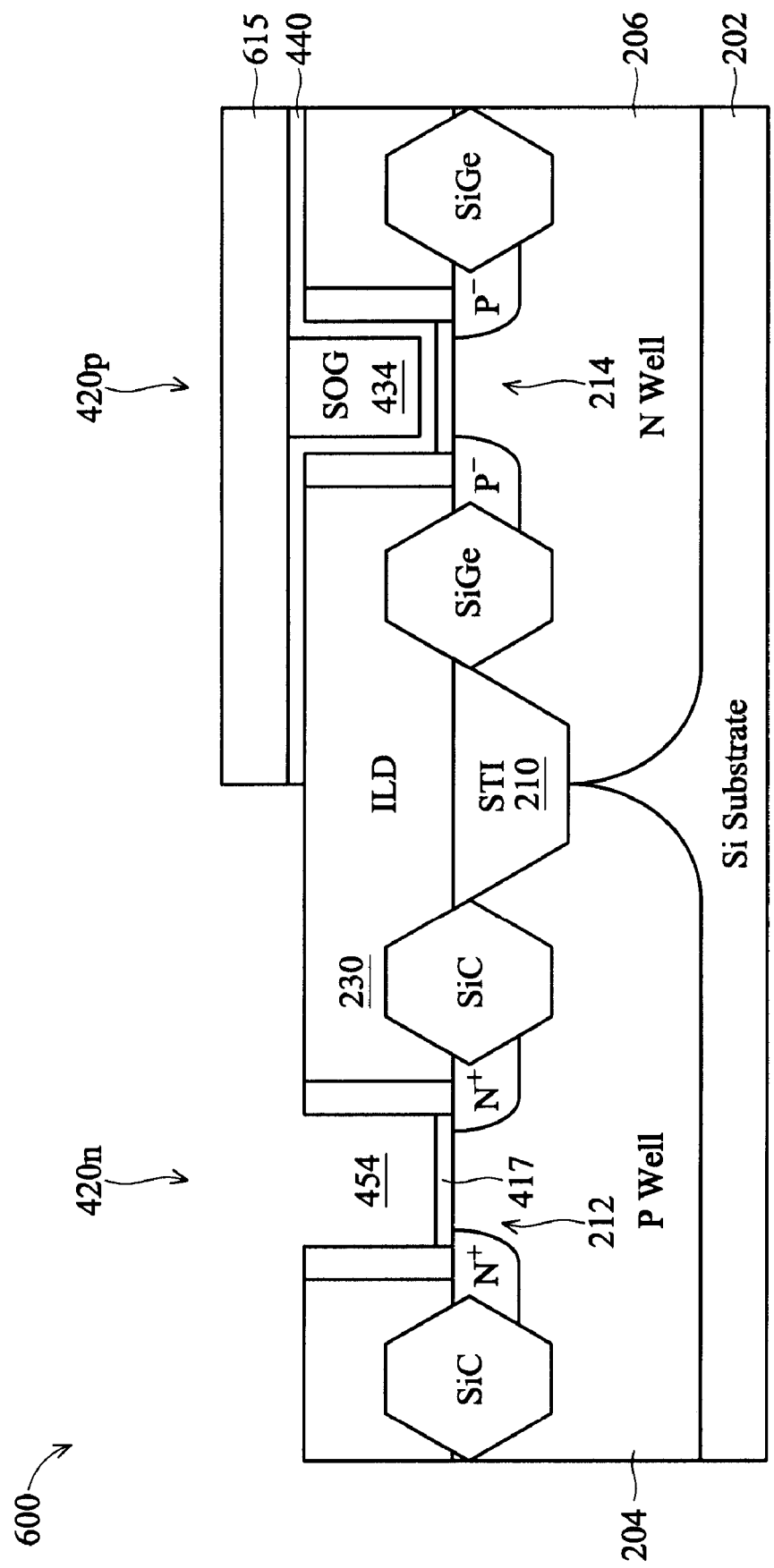

The method 500 continues with block 514 in which the first metal layer overlying the second region may be removed. In FIG. 6C, the P-metal layer 440 in the nFET 212 device side may be removed by a dry etching, wet etching, or combination dry and wet etching process. A patterned photoresist layer 615 may be formed by photolithography or other suitable process to protect the P-metal layer 440 and the remaining portion of the SOG layer 450 in the pFET 214 device side. A wet etching process using a solution of NH$_4$OH:H$_2$O$_2$:deionzied water or other suitable etchant may be used to selectively remove the unprotected P-metal layer 440 in the nFET 212 device side. The wet etching process may stop at the ILD 230. Alternatively, a wet etching process using a solution of diluted HF (DHF) and solvent may be used to remove unprotected portions of the SOG layer.

The method 500 continues with block 516 in which the second dummy gate of the second gate structure may be removed thereby forming a second trench. Still referring to FIG. 6C, the dummy poly gate 218 in the gate structure 420n of the nFET 212 may be removed by a dry etching, wet etching, or combination dry and wet etching process. For example, a wet etching process may include exposure to a hydroxide containing solution (e.g., ammonium hydroxide), de-ionized water, and/or other suitable etchant solutions. It should be noted that the barrier layer 417 in the gate structure 420n may function as an etch stop or barrier for the etching process. The dummy poly gate 218 may be selectively etched thereby forming a trench 454 in the gate structure 420n in the nFET 214 device side. The patterned photoresist layer 615 may be removed by a stripping process or other suitable process.

Figure 6D:
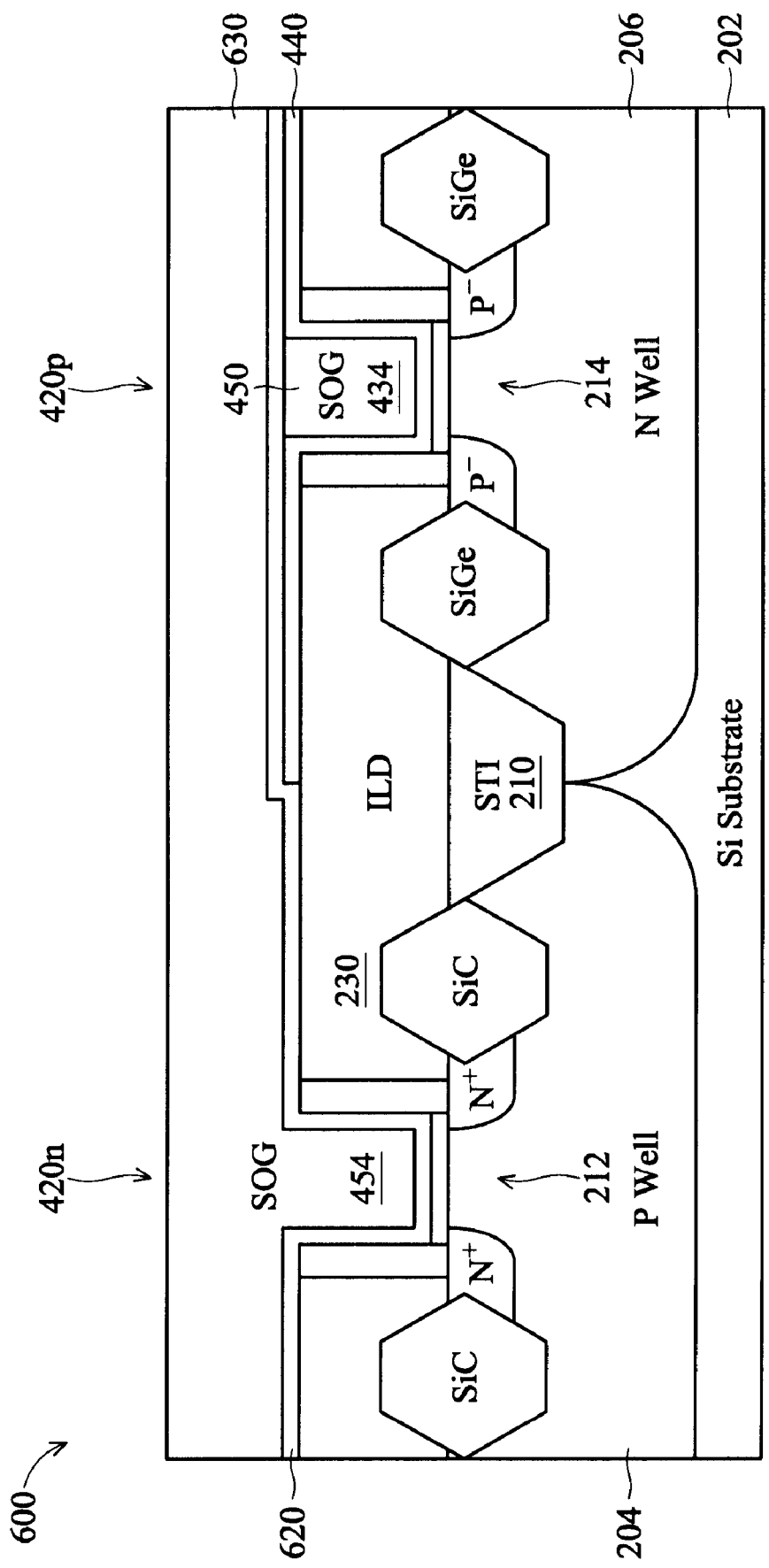

The method 500 continues with block 518 in which a second metal layer may be formed to partially fill in the second trench. In FIG. 6D, a work function metal layer may be formed to partially fill in the trench 454 in the nFET 212 side. In the present embodiment, an N-type work function metal (N-metal) 620 may be formed over the barrier layer 417 of the gate structure 420n, and may fill in a portion of the trench 454. Also, the N-metal layer 620 may be formed on the P-metal layer 440 and remaining SOG layer 450 in the pFET 214 device side. The N-metal 620 may include a layer of TiAl and may have a thickness ranging from about 10 to about 100 angstrom (A). The N-metal layer 620 may be formed by ALD, PVD, CVD, or other suitable process. Alternatively, the N-metal layer 620 may optionally include other suitable metals, such as Ti, Ag, Al, TiAlN, TaC, TaCN, TaSiN, Mn, or Zr that properly perform in the nFET 212. Further, the N-metal layer 620 may also include a multi-metal layer structure.

The method 500 continues with block 520 in which a second material layer may be formed over the second metal layer filling in the remainder of the second trench. Still referring to FIG. 6D, a material layer 630 may be formed over the N-metal layer 620 by a spin-on or spin-coating process. In the present embodiment, the material layer 630 may be formed of the same material as the material layer 450. The material layer 630 may include a spin-on-glass (SOG). The SOG layer 630 may substantially fill in the remainder of the trench 454. It should be noted that the SOG is capable of filling in small gaps, and thus the risk of forming voids in the trench 454 may be minimized. Further, a high etching selectivity between the SOG layer 630 and metal layer 620 provides for better process control during patterning of the metal layers as discussed below. Moreover, the SOG layer 630 is able to withstand encroachment of a metal etching chemical during subsequent patterning of the metal layers. Alternatively, the material layer 630 may optionally include other dielectric materials that are suitable for filling in the trench 454 and adhering to the underlying N-metal layer 620 during subsequent processing as discussed below. For example, the material layer 630 may optionally include a polymer, ceramic (with a low melting point), liquid crystal, and other dielectric materials. The polymer and ceramic may include polymer resins and metal oxides, respectively, that are used in semiconductor manufacturing.

Figure 6E:
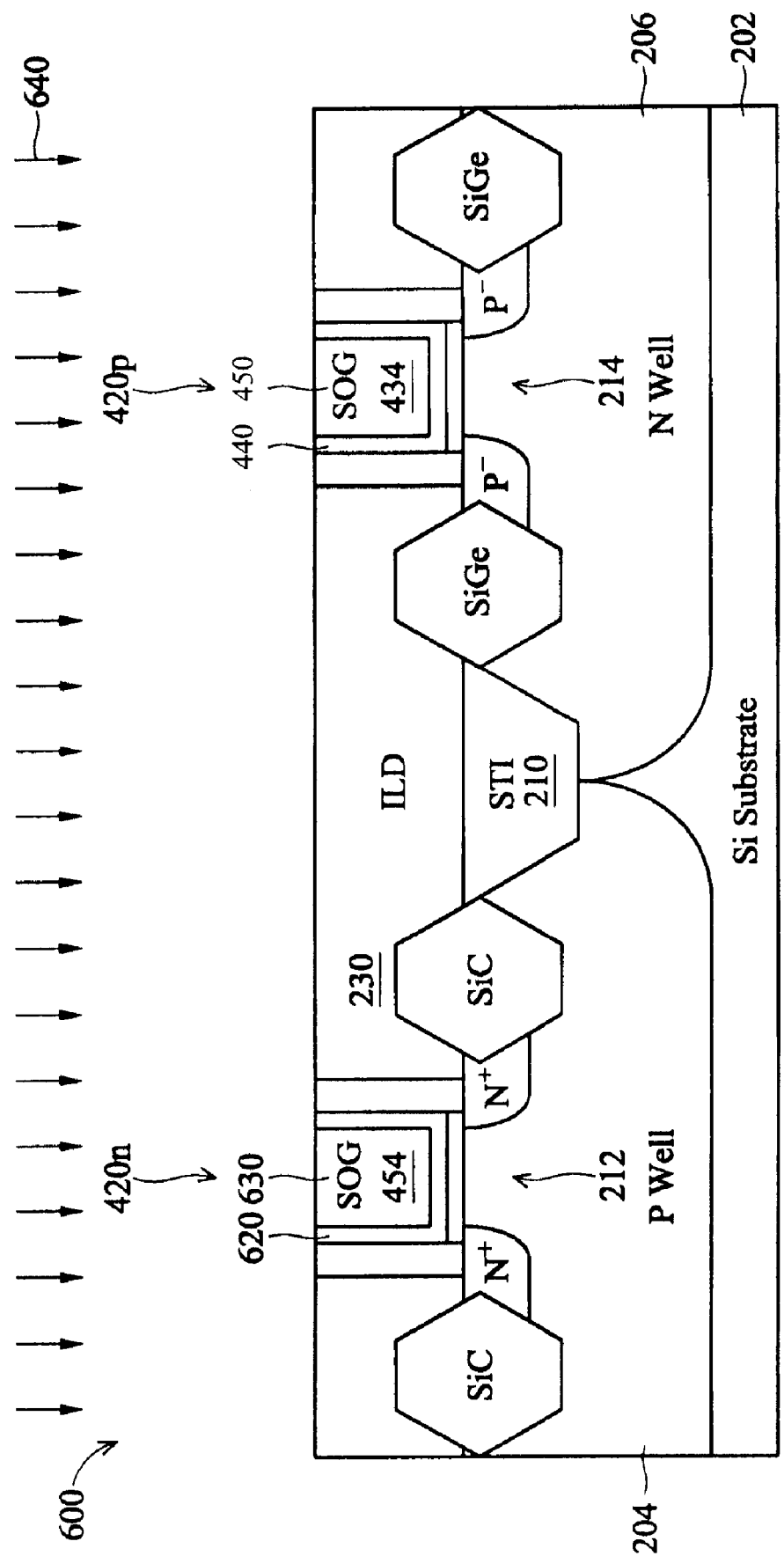

The method 500 continues with block 522 in which a second CMP may be performed. In FIG. 6E, a CMP 640 process may be performed to planarize and remove the various layers (SOG layer 630, N-metal layer 620, and P-metal layer 440) outside of the trenches 434, 454. The CMP 640 may substantially stop at the ILD layer 230. Further, the CMP 640 may have a high selectivity to provide a substantially planar surface for the gate structures 420n, 420p and ILD layer 230. Alternatively, the various metal layers 440, 620 and SOG layer 630 may be removed may a combination CMP and etching process as discussed above.

The method 500 continues with blocks 524, 526, and 528 which are similar to blocks 322, 324, and 326 of the method 300 in FIG. 3 to complete fabrication of the metal gates for nFET 212 and pFET 214 devices. It is understood that the semiconductor device 600 may undergo further processing to form various features such as contacts/vias, interconnect metal layers, interlayer dielectric, passivation layers, etc. Further, although the method 500 discloses forming the P-metal layer first and forming the N-metal layer second, it is understood that the method 500 may be used to form the N-metal layer first and the P-metal layer second in a similar manner. It should be noted that the techniques and processes disclosed with reference to FIGS. 5 and 6A to 6E can also be implemented in the embodiments disclosed above with reference to FIGS. 1 and 2A-2L, and FIGS. 3 and 4A-4L.

The present invention achieves different advantages in various embodiments disclosed herein. It is understood that different embodiments disclosed herein offer several different advantages, and that no particular advantage is necessarily required for all embodiments. For example, the present disclosed method provides a simple and cost-effective method for forming high-k gate dielectric in a gate last process using a dummy dielectric. Thus, the high-k gate dielectric quality in the final device is improved since the high-k dielectric experiences less thermal processes (e.g., less thermal cycles on the high-k dielectric). Additionally, the methods and devices disclosed herein form a high-k gate dielectric on a smaller portion of the gate sidewall in a gate last approach. Accordingly, the gate to source/drain fringing capacitance is reduced thereby improving the operational speed (e.g., switching on/off) of the transistors.

Moreover, the present disclosed method provides a simple and cost-effective method for forming metal gates with proper work functions for nFET and pFET devices in a gate last process. The methods disclosed herein minimize the risk of photoresist peeling and photoresist residue by using other material layers such as SOG layers for N/P metal patterning. The SOG layer provides for better adhesion to the metal layers as compared to the photoresist. Additionally, the SOG layer is more resistant to encroachment of the metal etching chemical. Further, the SOG layer and metal layer have a high selectivity so as to provide better control for the CMP and etching processes. Further, the methods and devices disclosed herein may easily be integrated with current CMOS process flow and semiconductor processing equipment. For example, the methods disclosed herein implement materials and processes that are friendly and compatible with the CMOS process flow, and that are inexpensive to incorporate with the process flow.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, the techniques, methodologies, and processes disclosed with reference to FIGS. 1, 3, and 5 can also be implemented and/or combined in any of the embodiments of FIG. 1, 3, or 5 such as lithography, etching, and high-k/metal gate formation.

What is claimed is:

1. A method of fabricating a semiconductor device, comprising:
   providing a semiconductor substrate having a first region and a second region;
   forming a first gate structure over the first region and a second gate structure over the second region, the first gate structure including a first dummy dielectric and a first dummy gate, the second gate structure including a second dummy dielectric and a second dummy gate;

removing the first dummy gate and first dummy dielectric from the first gate structure thereby forming a first trench and removing the second dummy gate and second dummy dielectric from the second gate structure thereby forming a second trench;
forming a gate layer to partially fill the first and second trenches, the gate layer including a high-k dielectric layer;
forming a material layer to fill the remainder of the first and second trenches;
removing a portion of the material layer such that a remaining portion of the material layer protects a first portion of the gate layer located at a bottom portion of the first and second trenches, respectively;
removing a second portion of the gate layer;
removing the remaining portion of the material layer from the first and second trenches, respectively; and
forming a first metal gate in the first trench and a second metal gate in the second trench.

2. The method of claim 1, wherein the gate layer further includes an interfacial layer and a barrier layer, the high-k dielectric layer being disposed between the interfacial layer and the barrier layer.

3. The method of claim 2, wherein the interfacial layer includes $SiO_2$, HfSiO, SiON, or combinations thereof.

4. The method of claim 2, wherein the barrier layer includes TiN, TaN, or $Si_3N_4$.

5. The method of claim 1, wherein the high-k dielectric layer includes HfO, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfSiO, $(Ba,Sr)TiO_3$ (BST), $Al_2O_3$, or $Si_3N_4$.

6. The method of claim 1, wherein removing the portion of the material layer includes performing a dry etching process.

7. The method of claim 6, wherein the remaining portion of the material layer includes a thickness ranging from about 10 to about 100 angstrom (A).

8. The method of claim 1, wherein the material layer includes a spin-on-glass (SOG).

9. The method of claim 1, wherein removing the second portion of the gate layer includes performing a wet etching process.

10. The method of claim 9, wherein a third portion of the gate layer located on a lower portion of the sidewalls of the first and second trenches, respectively, is not etched by the wet etching process; and
wherein a final gate layer disposed in the first and second trenches, respectively, has a horn shape, the final gate layer including the first portion and the third portion of the gate layer.

11. A method of fabricating a semiconductor device, comprising:
providing a semiconductor substrate having a first region and a second region;
forming a first gate structure over the first region and a second gate structure over the second region, the first gate structure including a first dummy gate and the second gate structure including a second dummy gate;
removing the first dummy gate from the first gate structure thereby forming a first trench;
forming a first metal layer to partially fill the first trench;
forming a first material layer over the first metal layer, the first material layer substantially filling the remainder of the first trench;
removing the first metal layer and the first material layer overlying the second region;
removing the second dummy gate from the second gate structure thereby forming a second trench;
forming a second metal layer to partially fill the second trench;
forming a second material layer over the second metal layer, the second material substantially filling the remainder of the second trench;
removing the metal and material layers outside of the first and second trenches;
removing the first material layer from the first trench and the second material layer from the second trench; and
forming a third metal layer to substantially fill the first and second trenches.

12. The method of claim 11, wherein the first material layer and the second material layer are formed of a same material.

13. The method of claim 12, wherein the first material layer and the second material layer include a spin-on-glass (SOG).

14. The method of claim 11, wherein the first dummy gate includes a first dummy dielectric and a first dummy poly, and the second dummy gate includes a second dummy dielectric and a second dummy poly; and
wherein the method further includes prior to forming the first metal layer to partially fill the first trench, forming a high-k dielectric layer to fill a bottom portion of the first trench; and
wherein the method further includes prior to forming the second metal layer to partially fill the second trench, forming a high-k dielectric layer to fill a bottom portion of the second trench.

15. The method of claim 11, wherein removing the various layers outside of the first and second trenches further includes performing a chemical mechanical polishing (CMP), or a combined CMP and a dry etching process.

16. A method of fabricating a semiconductor device, comprising:
providing a semiconductor substrate having a first region and a second region;
forming a first gate structure over the first region and a second gate structure over the second region, the first gate structure including a first dummy gate and the second gate structure including a second dummy gate;
forming an interlayer dielectric (ILD) over the first and second gate structures;
performing a first chemical mechanical polishing (CMP) on the ILD to expose the first and second dummy gates;
removing the first dummy gate from the first gate structure thereby forming a first trench;
forming a first metal layer to partially fill the first trench, the first metal layer having a first work function;
forming a first material layer over the first metal layer, the first material layer substantially filling the remainder of the first trench;
removing the second dummy gate from the second gate structure thereby forming a second trench;
forming a second metal layer to partially fill the second trench, the second metal layer having a second work function different from the first work function;
forming a second material layer over the second metal layer, the second material layer substantially filling the remainder of the second trench, the second material layer being formed of substantially the same material as the first material layer;
performing a second CMP that substantially stops at the ILD;
removing the first material layer from the first trench and the second material layer from the second trench; and forming a third metal layer to substantially fill the first and second trenches.

17. The method of claim 16, further comprising, after forming the third metal layer, performing a third CMP that substantially stops at the ILD thereby forming a first metal gate for the first gate structure and a second metal gate for the second gate structure, the first metal gate including the first metal layer and the third metal layer, the second metal gate including the second metal layer and the third metal layer.

18. The method of claim 16, further comprising, prior to removing the second dummy gate, removing the first material layer and the first metal layer overlying the second region.

19. The method of claim 18, wherein removing the first material layer and the first metal layer overlying the second region includes:

forming a photoresist layer to protect the first material layer and the first metal layer overlying the first region; and etching the first material layer and the first metal layer overlying the second region.

20. The method of claim 18, wherein removing the first material layer and the first metal layer overlying the second region includes:

performing a third CMP that substantially stops at the first metal layer;

forming a photoresist layer to protect the various layers overlying the first region; and etching the first metal layer overlying the second region.

* * * * *